United States Patent
Olsen et al.

(10) Patent No.: US 8,334,494 B2
(45) Date of Patent: Dec. 18, 2012

(54) LARGE DYNAMIC RANGE CAMERAS

(75) Inventors: Richard Ian Olsen, Irvine, CA (US);
Darryl L. Sato, Irvine, CA (US);
Feng-Qing Sun, Irvine, CA (US); James Gates, Irvine, CA (US)

(73) Assignee: Protarius Filo AG, L.L.C., Dover, DE (US)

( * ) Notice: Subject to any disclaimer, the term of this patent is extended or adjusted under 35 U.S.C. 154(b) by 0 days.

(21) Appl. No.: 13/465,229

(22) Filed: May 7, 2012

(65) Prior Publication Data

US 2012/0218435 A1 Aug. 30, 2012

Related U.S. Application Data

(63) Continuation of application No. 12/496,854, filed on Jul. 2, 2009, now Pat. No. 8,198,574, which is a continuation of application No. 11/788,122, filed on Apr. 19, 2007, now Pat. No. 7,564,019, and a continuation-in-part of application No. 11/212,803, filed on Aug. 25, 2005, now abandoned.

(60) Provisional application No. 60/795,882, filed on Apr. 28, 2006, provisional application No. 60/695,946, filed on Jul. 1, 2005, provisional application No. 60/604,854, filed on Aug. 25, 2004.

(51) Int. Cl.
*H01L 27/00* (2006.01)

(52) U.S. Cl. .................................. 250/208.1

(58) Field of Classification Search ............... 250/208.1; 348/273, 302, 308
See application file for complete search history.

(56) References Cited

U.S. PATENT DOCUMENTS

| | | | |
|---|---|---|---|
| 3,609,367 | A | 9/1971 | Barron |
| 3,971,065 | A | 7/1976 | Bayer |
| 4,323,925 | A | 4/1982 | Abell et al. |
| 4,385,373 | A | 5/1983 | Howe |
| 4,894,672 | A | 1/1990 | Tanaka |
| 5,005,083 | A | 4/1991 | Grage et al. |
| 5,051,830 | A | 9/1991 | Von Hoessle |
| 5,436,660 | A | 7/1995 | Sakamoto |
| 5,654,752 | A | 8/1997 | Yamazaki |
| 5,691,765 | A | 11/1997 | Schieltz et al. |
| 5,694,165 | A | 12/1997 | Yamazaki et al. |
| 5,742,659 | A | 4/1998 | Atac et al. |
| 5,760,832 | A | 6/1998 | Yamanaka et al. |
| 5,766,980 | A | 6/1998 | Ohtagaki et al. |

(Continued)

FOREIGN PATENT DOCUMENTS

EP    0 599 470    6/1994

(Continued)

OTHER PUBLICATIONS

Duparre et al., "Artificial apposition compound eye fabricated by micro-optics technology," Applied Optics, vol. 43, No. 22, Aug. 2004, pp. 4303-4310.

(Continued)

*Primary Examiner* — Seung C Sohn

(57) ABSTRACT

A digital camera includes a plurality of channels and a processing component operatively coupled to the plurality of channels. Each channel of the plurality of channels includes an optics component and a sensor that includes an array of photo-detectors. The processing component is configured to separately control an integration time of each channel, where a first integration time of a first channel is less than a second integration time of a second channel. The processing component is also configured to combine data from the plurality of channels to generate an image.

20 Claims, 24 Drawing Sheets

U.S. PATENT DOCUMENTS

| | | | |
|---|---|---|---|
| 5,850,479 A | 12/1998 | Terry et al. |
| 6,137,535 A | 10/2000 | Meyers |
| 6,375,075 B1 | 4/2002 | Ackley et al. |
| 6,381,072 B1 | 4/2002 | Burger |
| 6,429,898 B1 | 8/2002 | Shoda et al. |
| 6,437,335 B1 | 8/2002 | Bohn |
| 6,570,613 B1 | 5/2003 | Howell |
| 6,611,289 B1 | 8/2003 | Yu et al. |
| 6,617,565 B2 | 9/2003 | Wu |
| 6,714,239 B2 | 3/2004 | Guidash |
| 6,727,521 B2 | 4/2004 | Merrill |
| 6,765,617 B1 | 7/2004 | Tangen et al. |
| 6,833,873 B1 | 12/2004 | Suda |
| 6,834,161 B1 | 12/2004 | Stiehler |
| 6,841,816 B2 | 1/2005 | Merrill et al. |
| 6,859,299 B1 | 2/2005 | Chiao |
| 6,882,368 B1 | 4/2005 | Suda |
| 6,882,864 B2 | 4/2005 | Miyake |
| 6,885,398 B1 | 4/2005 | Sladen |
| 6,885,404 B1 | 4/2005 | Suda |
| 6,885,508 B2 | 4/2005 | Yamaguchi et al. |
| 6,903,770 B1 | 6/2005 | Kobayashi et al. |
| 6,946,647 B1 | 9/2005 | O'Neill et al. |
| 6,952,228 B2 | 10/2005 | Yoneda et al. |
| 7,095,159 B2 | 8/2006 | Machida |
| 7,115,853 B2 | 10/2006 | Jiang et al. |
| 7,123,298 B2 | 10/2006 | Schroeder et al. |
| 7,170,665 B2 | 1/2007 | Kaneko et al. |
| 7,199,348 B2 | 4/2007 | Olsen et al. |
| 7,206,136 B2 | 4/2007 | Labaziewicz et al. |
| 7,214,926 B2 | 5/2007 | Gruhlke et al. |
| 7,223,954 B2 | 5/2007 | McNulty |
| 7,236,306 B2 | 6/2007 | Janson, Jr. et al. |
| 7,239,345 B1 | 7/2007 | Rogina |
| 7,256,944 B2 | 8/2007 | Labaziewicz et al. |
| 7,280,290 B2 | 10/2007 | Araki et al. |
| 7,305,180 B2 | 12/2007 | Labaziewicz |
| 7,358,483 B2 | 4/2008 | Mitsugi et al. |
| 7,362,357 B2 | 4/2008 | Brown et al. |
| 7,379,104 B2 | 5/2008 | Hattori et al. |
| 7,417,674 B2 | 8/2008 | Gruhlke |
| 7,453,510 B2 | 11/2008 | Kolehmainen et al. |
| 7,460,160 B2 | 12/2008 | Hershey et al. |
| 2002/0020845 A1 | 2/2002 | Ogura et al. |
| 2002/0024606 A1 | 2/2002 | Yuki et al. |
| 2002/0051071 A1 | 5/2002 | Itano et al. |
| 2002/0067416 A1 | 6/2002 | Yoneda et al. |
| 2002/0075481 A1 | 6/2002 | Roustaei |
| 2002/0089596 A1 | 7/2002 | Suda |
| 2002/0113888 A1 | 8/2002 | Sonoda et al. |
| 2002/0122124 A1 | 9/2002 | Suda |
| 2002/0142798 A1 | 10/2002 | Miyake |
| 2003/0020814 A1 | 1/2003 | Ono |
| 2003/0086013 A1 | 5/2003 | Aratani |
| 2003/0097511 A1 | 5/2003 | Choi et al. |
| 2003/0151685 A1 | 8/2003 | La Grone |
| 2003/0160886 A1 | 8/2003 | Misawa et al. |
| 2003/0209651 A1 | 11/2003 | Iwasaki |
| 2003/0234907 A1 | 12/2003 | Kawai |
| 2004/0012688 A1 | 1/2004 | Tinnerino et al. |
| 2004/0012689 A1 | 1/2004 | Tinnerino et al. |
| 2004/0017620 A1 | 1/2004 | Kaneko et al. |
| 2004/0027687 A1 | 2/2004 | Bittner et al. |
| 2004/0080638 A1 | 4/2004 | Lee |
| 2004/0095495 A1 | 5/2004 | Inokuma et al. |
| 2004/0183918 A1 | 9/2004 | Squilla et al. |
| 2005/0024731 A1 | 2/2005 | Mitchell et al. |
| 2005/0128335 A1 | 6/2005 | Kolehmainen et al. |
| 2005/0128509 A1 | 6/2005 | Tokkonen et al. |
| 2005/0134712 A1 | 6/2005 | Gruhlke et al. |
| 2005/0160112 A1 | 7/2005 | Makela et al. |
| 2005/0248667 A1 | 11/2005 | Schweng et al. |
| 2005/0285955 A1 | 12/2005 | Utz et al. |
| 2006/0087572 A1 | 4/2006 | Schroeder |
| 2006/0108505 A1 | 5/2006 | Gruhlke et al. |
| 2006/0125936 A1 | 6/2006 | Gruhlke et al. |
| 2006/0187322 A1 | 8/2006 | Janson, Jr. et al. |
| 2006/0187338 A1 | 8/2006 | May et al. |
| 2006/0222220 A1 | 10/2006 | Yamano et al. |
| 2007/0002159 A1 | 1/2007 | Olsen et al. |

FOREIGN PATENT DOCUMENTS

| | | |
|---|---|---|
| EP | 1 032 045 | 8/2000 |
| JP | 62-011264 | 1/1987 |

OTHER PUBLICATIONS

Duparre et al., "Artificial compound eyes—different concepts and their application to ultra flat image acquisition sensors," Proceedings of SPIE, vol. 5346 (SPIE, Bellingham, WA, 2004), pp. 89-100.

Duparre et al., "Microoptical telescope compound eye," Optics Express, vol. 13, No. 3, Feb. 2005, pp. 889-903.

Duparre et al., "Theoretical analysis of an artificial superposition compound eye for application in ultra flat digital image acquisition devices," Proceedings of SPIE, vol. 5249, 2004, pp. 408-418.

Duparre et al., "Ultra-Thin Camera Based on Artificial Apposition Compound Eyes," Proc. 10th Microoptics Conference MOC '04, Jena, 2004, Paper E-2 (2 pages).

Final Office Action on U.S. Appl. No. 11/212,803, mailed Sep. 20, 2007.

First Office Action for Chinese Application 200580032374.0, notification date Feb. 5, 2010.

International Preliminary Report on Patentability for PCT/US2005/030256 issued Mar. 17, 2009.

International Preliminary Report on Patentability for PCT/US2006/025781 issued Mar. 10, 2009.

International Search Report and Written Opinion for PCT/US05/30256 mailed Jul. 7, 2008.

International Search Report and Written Opinion for PCT/US06/25781 mailed Jul. 22, 2008.

Kitamura et al., "Reconstruction of a high-resolution image on a compound-eye image-capturing system," Applied Optics, vol. 43, No. 8, Mar. 2004, pp. 1719-1727.

Miki et al., "A Study of Multi-Stack Silicon-Direct Wafer Donding for MEMS Manufacturing," 2002, IEEE, pp. 407-410.

Miyatake et al., "Thin observation module by bound optics (TOMBO0 with color filters," SPEI and IS&T, vol. 5301, 2004, pp. 7-12.

Non-final Office Action on U.S. Appl. No. 11/212,803, mailed Feb. 7, 2007.

Non-Final Office Action on U.S. Appl. No. 11/265,669, mailed Feb. 28, 2006.

Non-Final Office Action on U.S. Appl. No. 11/322,959, mailed Aug. 8, 2007.

Non-Final Office Action on U.S. Appl. No. 11/788,122, mailed Jun. 27, 2008.

Non-Final Office Action on U.S. Appl. No. 11/888,546, mailed May 1, 2008.

Non-Final Office Action on U.S. Appl. No. 11/888,570, mailed May 28, 2008.

Norvell, Robin, "Shellcase Debuts Ultra-Thin Miniaturization for Optics," Jul. 8, 2005, 1 page.

Notice of Allowance for U.S. Appl. No. 11/478,242, mailed Dec. 30, 2009.

Notice of Allowance for U.S. Appl. No. 11/888,546, mailed Dec. 14, 2009.

Notice of Allowance of U.S. Appl. No. 11/825,382, mailed May 5, 2010.

Notice of Allowance on U.S. Appl. No. 11/265,669, mailed Oct. 27, 2006.

Notice of Allowance on U.S. Appl. No. 11/788,122, mailed Mar. 9, 2009.

Notice of Allowance on U.S. Appl. No. 11/788,279, mailed Oct. 28, 2010.

Notice of Allowance on U.S. Appl. No. 11/810,623, mailed Feb. 2, 2011.

Notice of Allowance on U.S. Appl. No. 11/888,546, mailed Dec. 2, 2008.

Notice of Allowance on U.S. Appl. No. 11/888,546, mailed Jun. 3, 2009.

Notice of Allowance on U.S. Appl. No. 11/888,570, mailed Mar. 23, 2009.
Notice of Allowance on U.S. Appl. No. 11/888,582, mailed Aug. 6, 2010.
Office Action for U.S. Appl. No. 11/825,382, mailed Oct. 29, 2009.
Office Action on U.S. Appl. No. 11/788,279, mailed Jan. 21, 2010.
Office Action on U.S. Appl. No. 11/810,623, mailed Aug. 18, 2010.
Office Action on U.S. Appl. No. 11/478,242, mailed Sep. 16, 2009.
Office Action on U.S. Appl. No. 11/788,120, mailed Apr. 16, 2010.
Office Action on U.S. Appl. No. 11/788,120, mailed May 19, 2009.
Office Action on U.S. Appl. No. 11/788,120, mailed Jul. 30, 2010.
Office Action on U.S. Appl. No. 11/788,120, mailed Sep. 18, 2009.
Office Action on U.S. Appl. No. 11/788,279, mailed Aug. 4, 2010.
Non-Final Office Action on U.S. Appl. No. 11/810,623 mailed Feb. 4, 2010.
Search Report for EP Application 05793927.4, dated Feb. 26, 2010.
Second Office Action on Chinese Application 200580032374.0, issued Sep. 9, 2010.
Shogenji et al., "Bimodal fingerprint capturing system based on compound-eye imaging module," Applied Optics, vol. 43, No. 6, Feb. 2004, pp. 1355-1359.
Shogenji et al., "Multispectral imaging using compact compound optics," Optics Express, vol. 12, No. 8, Apr. 2004, pp. 1643-1655.
Stager et al., "Replicated Micro-Optics for Automotive Applications," SPIE European Workshop on Photonics in the Automobile, Geneva, 2004, (8 pages).
Tanida et al., "Compact image capturing system based on compound imaging and digital reconstruction," Proceedings of SPIE, vol. 4455, 2001, pp. 34-41.
Tanida, "Color imaging with an integrated compound imaging system," Optics Express, vol. 11, No. 18, Sep. 2003, pp. 2109-2117.
Third Office Action issued on Chinese Application 200580032374.0, mailed May 24, 2011 (with English translation).
Volkel et al., "Miniaturization of Imaging Systems," mstnews, Feb. 2003, pp. 36-38.
Volkel et al., "Miniaturized imaging systems," Elsevier Science B.V., Microelectronic Engineering 67-68 (2003), pp. 461-472.
Wood et al., "Resolution Improvement for Compound Eye Images Through Lens Diversity," IEEE, Signal Processing Society, DSP/SPE Workshop, Aug. 2, 2004 (5 pages).
Notice of Allowance on U.S. Appl. No. 11/729,132, mailed Oct. 11, 2011.
Non-Final Office Action on U.S. Appl. No. 11/729,132, mailed Feb. 3, 2011.
Notice of Allowance on U.S. Appl. No. 12/496,854, mailed Feb. 16, 2012.
Communication from the European Patent Office on European Patent Application 05793927.4, mailed Feb. 10, 2012.
Notice of Allowance on U.S. Appl. No. 13/006,351, mailed May 17, 2011.
Notice of Allowance on U.S. Appl. No. 13/100,725 mailed Jul. 23, 2012.

LARGE DYNAMIC RANGE CAMERAS

CROSS-REFERENCE TO RELATED PATENT APPLICATIONS

This application is a Continuation of U.S. patent application Ser. No. 12/496,854, filed Jul. 2, 2009, which is a Continuation of U.S. patent application Ser. No. 11/788,122, filed Apr. 19, 2007, which is a Continuation-In-Part of U.S. patent application Ser. No. 11/212,803, filed Aug. 25, 2005, which claims priority to U.S. Provisional Patent Application No. 60/695,946 filed on Jul. 1, 2005 and to U.S. Provisional Patent Application No. 60/604,854 filed on Aug. 25, 2004; U.S. patent application Ser. No. 11/788,122 also claims priority to U.S. Provisional Patent App. No. 60/795,882 filed Apr. 28, 2006. Each of the above-referenced patent applications is incorporated herein by reference in its entirety.

TECHNICAL FIELD

The following disclosure relates generally to optical devices and more particularly to expanding the dynamic exposure range in digital cameras.

BACKGROUND

Image sensors can be realized with semiconductors based on their capability to convert locally impinging light energy into a proportional amount of electronic charge. This electronic charge "Q" is often referred to as photo-charge, and can be integrated within the pixel on a storage device such as a reverse biased diode or as a pre-charged metal-oxide-semiconductor capacitance. The finite charge storage capacitance within each pixel limits the amount of integrated photo-charge. Dynamic range is measured as the ratio of the maximum photo-charge that can be meaningfully integrated in a pixel of the imager to the pixel noise level.

Intrascene dynamic range refers to the range of incident light that can be accommodated by an image sensor in a single frame of pixel data. Examples of high dynamic scenes range scenes include an indoor room with a window view of the outdoors, an outdoor scene with mixed shadows and bright sunshine, and evening or night scenes combining artificial lighting and shadows. In a typical charge coupled device (CCD) or CMOS active pixel sensor (APS), the available dynamic range is in a range of 1,000:1 to about 4,000:1. Unfortunately, many outdoor and indoor scenes with highly varying illumination have a dynamic range significantly greater than 4,000:1. Image sensors with intrascene dynamic range significantly greater than 4,000:1 are required to meet many imaging requirements.

The dynamic range of an image sensor can be increased by using multiple exposure times and/or integration times. For example, U.S. Pat. No. 4,647,975 describes a method based on the acquisition of two or more images, each having an exposure time. Once numerous images have been taken at different exposure times, the images have to be fused or merged to form one single piece of pixel information having a wide dynamic range. U.S. Pat. Nos. 4,647,975, 5,168,532, and 5,671,013 disclose the use of a selection rule to combine information from the most suitable of the multiple images. The merged pixel information or value is then multiplied by a suitable factor that corrects for the respective exposure times. This method however exhibits undesirable temporal aliasing if the scene or camera is moving because the two or more images having different exposure times are captured using the same image sensor and thus are not captured concurrently.

Despite improvements in solid-state image sensor and digital camera technology, the light signal or brightness range of scenes often exceeds the dynamic range of the sensor. For this reason, numerous methods have been described in the art of image sensors to extend the dynamic or signal range. A summary of some methods is presented in: "Wide dynamic range sensors", Optical Engineering, Vol. 38, No. 10, pp. 1650-1660, October 1999. Methods to provide wide dynamic range imaging capability with a single image sensor include: (a) logarithmic or compressed response photo-detection; (b) multiple integration and charge storage capability within each pixel; (c) frequency based sensors, where the sensor output is converted to pulse frequency; (d) local integration time control, where different areas within the sensor can have different exposure times; (e) signal charge versus integration time rate (signal slope) measurement; (f) analog to digital conversion per pixel; and (g) autonomous pixel control. These methods require complex pixel circuitry and are difficult to implement in small pixel areas without taking up area required for the photo-detection mechanism (such as a photodiode).

Typical scenes imaged by digital cameras have light levels that span a range including low light (1-100 lux), moderate light (100-1000 lux), and bright light (1000-1,000,000 lux) under outdoor conditions. To accommodate lighting changes from scene to scene (the interscene dynamic range) an electronic shutter is used to change the integration time of all pixels in an array from frame to frame. To cover a single scene that might involve indoor lighting (100 lux) and outdoor lighting (100,000 lux), the required intrascene dynamic range is approximately 10,000:1, corresponding to 80 dB (14-bits). This exceeds the dynamic range of a single image sensor using a single integration time (typically 3,100:1 corresponding to 70 dB (12-bits)). Therefore, there is a need for a digital camera in which the effective single-frame dynamic exposure range is expanded.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference. diagram of a digital camera that includes multiple channels, under an embodiment.

DETAILED DESCRIPTION

Figure 1:
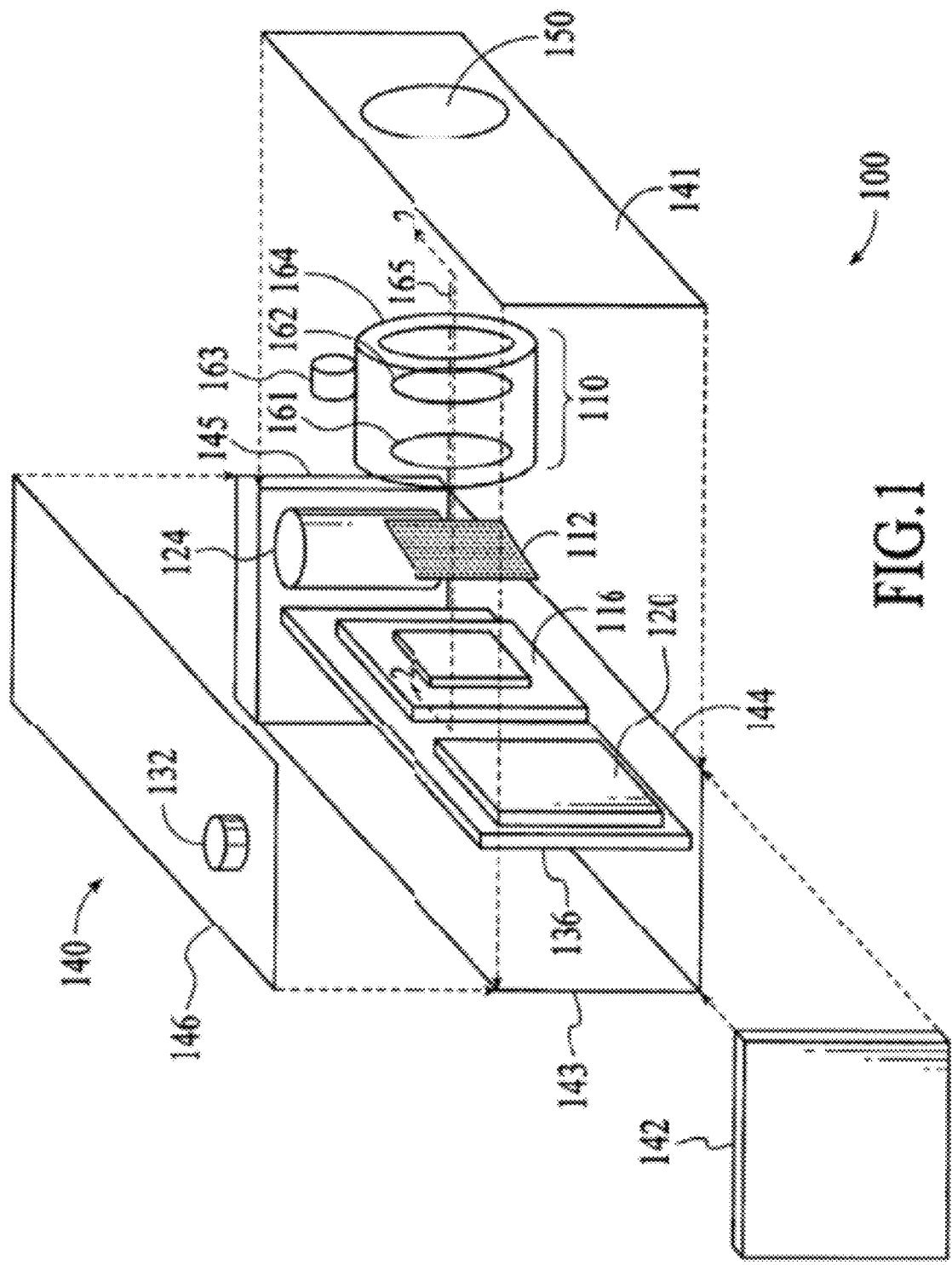
FIG. 1 is a block diagram of a conventional digital camera.

Digital camera systems and methods are described below that provide an expanded effective single-frame dynamic exposure range. The digital camera systems and methods, collectively referred to herein as digital camera systems, generally include two or more camera channels. Each channel includes an optics component and an image sensor having an active area including multiple picture elements (pixels). Each sensor is controlled under or with an independent signal integration time as described in detail below. Image capture by the camera is performed using the multiple camera channels, and each camera channel is controlled during a frame under an independent integration time. The integration time for each channel can be automatically controlled and/or controlled in response to a user input. A wide range of integration times are available for use in an embodiment. The images obtained in each channel under the different integration times are obtained simultaneously or nearly simultaneously, so undesirable temporal aliasing from moving scenes or camera motion is minimized.

The digital camera systems, through the use of multiple integration times, enable formation of an image having a wide dynamic range by combining the data from all camera channels to form a composite single frame. The wide dynamic range of an embodiment is generally greater that the dynamic range obtained by a conventional digital camera with a single image sensor channel and one integration time.

Conventional digital cameras may have a maximum photo-signal storage capacity that limits the dynamic range of the particular system. The photo-signal charge is stored on a capacitor within the pixel area. The charge handling capacity is limited by the maximum voltage swing in the integrated circuitry and the storage capacitance within the pixel. The amount of integrated photo-charge is directly related to the time the image sensor collects and integrates signal from the scene. This is known as integration time. A long integration time is desired for weak signals since more photo-charge is integrated within the pixel and the signal-to-noise of the digital camera is improved. Once a maximum charge capacity is reached, the sensor no longer senses image brightness resulting in data loss. Therefore, the use of a single integration time for the entire field of view creates an imaging dilemma in conventional cameras. The digital camera integration time can be set to image low light levels and saturate bright signals or image high light levels and not detect low light levels (since the integrated photo-charge from low light levels is below the signal-to-noise of the sensor).

The digital cameras described herein overcome this dynamic range limitation through the use of multiple camera channels, including multiple optics and image sensors on a single integrated circuit (IC) or semiconductor substrate. The multiple camera channels are configured to image the same field of view simultaneously, and each operates independently under a different integration time. The digital camera can include, for example, a 3 by 3 assembly of image sensors, perhaps three sensor of each color (e.g., red (R), green (G), and blue (B)) and the integration time of the sensors associated with each color can be varied, for example, each color can have three distinct values (e.g., 0.1 msec, 1 msec, and 10 msec integration time, respectively). The data from all sensors can be digitally combined to provide a much greater dynamic range within one frame of digital camera data. The raw digital camera data could be used by digital signal processing of the scene. The digital data can also be stored and displayed to exhibit low light or bright light characteristics as desired.

Exposure is the total amount of light allowed to fall on a sensor during the process of taking a photograph. Exposure control is control of the total amount of light incident on a sensor during the process of taking a photograph.

In contrast to exposure control, which is used by conventional digital cameras to manage dynamic range, the digital camera systems of an embodiment use integration time control to control the time the electrical signal is integrated on a charge storage device (capacitance) within a sensor (pixel), as described herein. Integration time control, also referred to as "focal plane shutter" control, controls the time the electrical signal is integrated or accumulated by controlling a switch (e.g., charge integration switch) coupled or connected to the sensor or a photo-detection mechanism of a sensor. For example, the charge integration switch is placed in a state to allow charge to accumulate within the sensor for a period of time approximately equal to the integration time corresponding to that sensor; upon completion of the integration period, the switch is placed in a state to transfer the accumulated charge as a photo-signal to a processing component. Digital camera components or circuitry are configured to allow independent control of the charge integration switch associated with each sensor, thereby making possible dynamic range control for each sensor. The integration time control can be executed (depending on readout configuration) according to a number of techniques, for example, rolling mode and/or snap-shot mode to name a few.

Generally, the digital camera systems of an embodiment provide digital cameras with large effective single-frame dynamic exposure ranges. The digital camera systems include multiple channels. Each channel includes an optics component and sensor comprising an array of photo-detectors. The sensors of the camera channels are integrated on a semiconductor substrate. The camera systems include a processing component coupled to the channels. The processing component is configured to separately and simultaneously control an integration time of each channel. The integration time of at least one channel is controlled relative to the integration time of at least one other channel so that an image formed by combining data of a frame received simultaneously from the channels has a relatively large dynamic range.

A digital camera according to an embodiment includes multiple (e.g., two or more) closely spaced image sensor camera channels integrated on or in a common semiconductor substrate. Each sensor camera channel has its own optics, photo-detection and readout mechanism that includes a plurality of picture elements (pixels) with independent signal integration time control. The pixel area, including photo-detector and circuitry, can be as small as 2 μm by 2 μm but is not so limited. The individual camera channels of an embodiment look at the same field of view.

Each image sensor camera channel for example includes a plurality of pixels, wherein at least two channels may be individually interrogated, for example, the channels can independently be reset, integrate charge for a predetermined and unique time period, and read out. The digital camera further comprises circuitry and/or algorithms for individually interrogating the camera image sensor camera channels, for combining output values of said subsets into combined output values to from a high dynamic range composite image within a single frame of data, and for electrically outputting said composite image.

The digital camera systems and methods of an embodiment use a range of integration times, $T_{long}$ to $T_{short}$, for each channel to increase significantly the dynamic range of the digital camera, while insuring a signal overlap between the images. For example, the dynamic range of a digital camera using the methods described herein can be increased from approximately 70 dB to 90 dB using a ratio of $T_{long}/T_{short}$ equal to 25. The use of a long integration time in one camera channel allows dark objects to be detected, whereas very bright objects are not, due to saturation of the corresponding pixels storage capacity. In contrast, the use of a short integration time in another channel enables detection of bright objects, whereas very dark objects are not detected due to a weak signal below the noise floor of the pixel. The digital camera systems and methods described below suitably combine the output signals of both exposures to increase the dynamic range of the digital camera.

The sensor camera channel output values $P_{short}$ to $P_{long}$, measured with different exposure times, of the camera system described below may not be related ideally through the ratio ($t=T_{long}/T_{short}$), for example, $P_{long}$ may be close to but not identical with $t \cdot P_{short}$ due to non-linear photo-response. For this reason the methods of an embodiment include algorithms that combine the two values to form a large dynamic range composite image in a manner that does not lead to image artifacts and pattern noise.

FIG. 1 is a block diagram of a conventional digital camera 100. The digital camera 100 includes a lens assembly 110, a color filter array layer 112, an image sensor 116, and an electronic image storage media 120. The camera 100 also includes a power supply 124, a peripheral user interface (represented as a shutter button) 132, a circuit board 136 (which supports and electrically interconnects the aforementioned components), a housing 140 (including housing portions 141, 142, 143, 144, 145 and 146) and a shutter assembly (not shown), which controls an aperture 150 and passage of light into the digital camera 100. A mechanical frame 164 is used to hold the various parts of the lens assembly 110 together. The lens assembly 110 includes lenses 161 and 162 and one or more electro-mechanical devices 163 to move the lenses 161 and 162 along a center axis 165. The lenses 161 and 162 can be made up of multiple elements arranged together to in any combination to form an integral optical component. Additional lenses can be used if necessary. The electromechanical device 163 portion of the lens assembly 110 and the mechanical frame 164 portion of the lens assembly 110 can include numerous components and/or complex assemblies.

The color filter array layer 112 has an array of color filters arranged in a Bayer pattern (e.g., a 2 by 2 matrix of colors with alternating red and green in one row and alternating green and blue in the other row, although other colors may be used). The Bayer pattern is repeated throughout the color filter array. In some imaging applications, such as broadband visible imaging color filter layers 112 are not required. In other color imaging applications different color filters are used or color separation capability is built into the image sensor detection mechanism.

The image sensor 116 contains a plurality of identical photo detectors (alternatively referred to as "picture elements" or "pixels") arranged in a matrix. The number of photo detectors is usually in a range of hundreds of thousands to millions. The lens assembly 110 spans the diagonal of the array.

Each of the color filters in the color filter array 112 is disposed above a respective one of the photo detectors in the image sensor 116, such that each photo detector in the image sensor receives a specific band of visible light (e.g., red, green or blue) and provides a signal indicative of the color intensity of the respective band. Signal processing circuitry (not shown) receives signals from the photo detectors, processes the signals, and ultimately outputs a color image.

The peripheral user interface 132, which includes the shutter button, can further include one or more additional input devices (e.g., for settings, controls and/or input of other information), one or more output devices, (e.g., a display for output of images or other information) and associated electronics.

Figure 2:
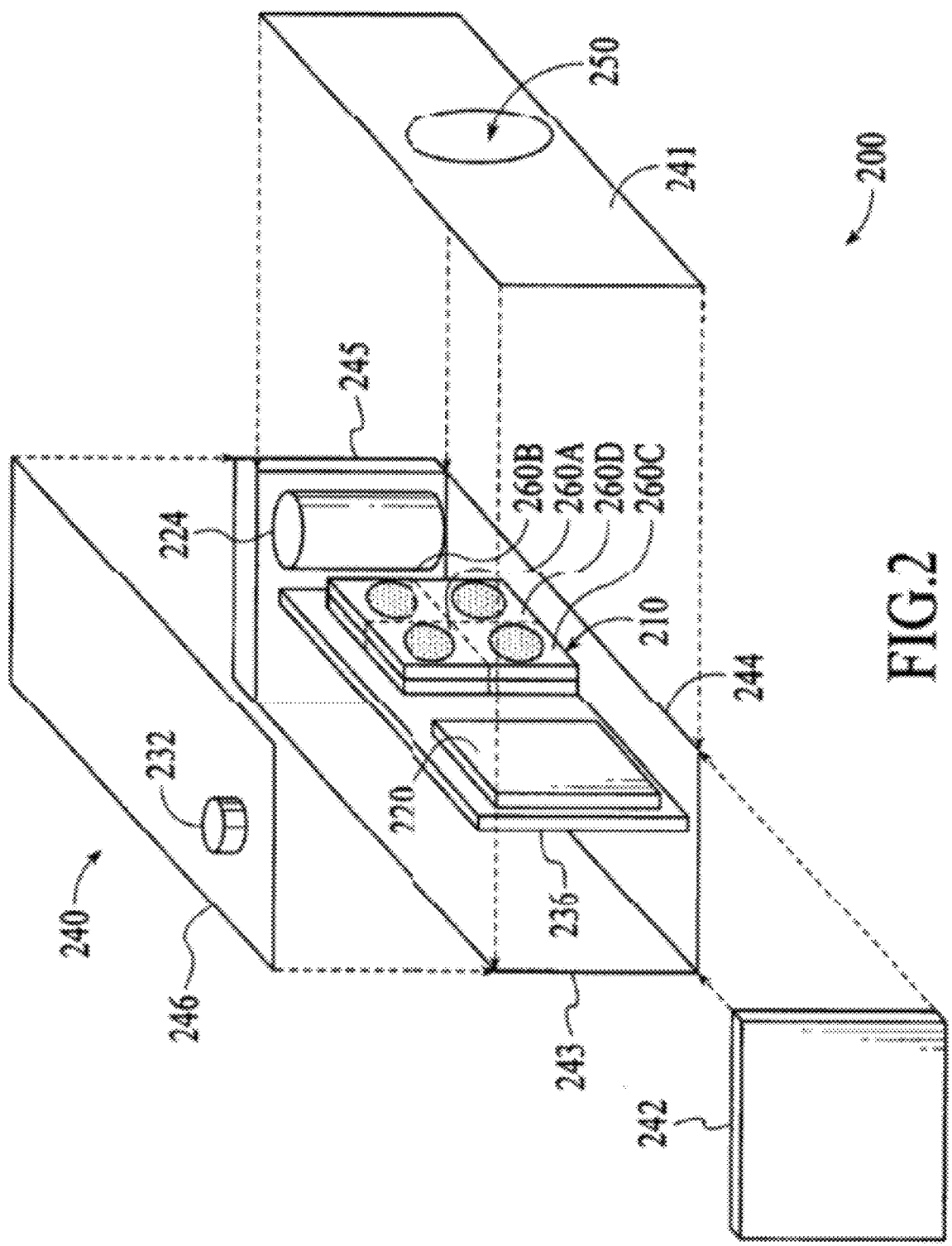
FIG. 2 is a block diagram of a digital camera that includes multiple channels, under an embodiment.

FIG. 2 is a block diagram of a digital camera 200 that includes multiple channels, under an embodiment. The digital camera 200 includes a digital camera subsystem 210 and an electronic image storage media 220. The digital camera 200 also includes a power supply 224, a peripheral user interface (represented as a shutter button) 232, a circuit board 236 (which electrically interconnects and/or supports one or more components), a housing 240 (including housing portions 241, 242, 243, 244, 245 and 246) and a shutter assembly (not shown), which controls an aperture 250 and passage of light into the digital camera 200.

The digital camera subsystem 210, also referred to herein as the "DCS" 210, includes one or more camera channels (e.g., four camera channels 260A-260D) and replaces (and/or fulfills one, some or all of the roles fulfilled by) the lens assembly 110, the color filter 112 and the image sensor 116 of the digital camera 100 described above. The four camera channels 260A-260D have a configurable or selectable signal integration time control that can be made optimal for a range of incident optical signal levels. The combination of signals from the four camera channels representing the varying integration times allow a greater range of incident photo-signal levels to be detected. Each camera channel, working in conjunction with a selected or programmed integration time, can be optimized to collect an incident light range; for example the optical f-number, photo-detector design, in-pixel circuitry and readout circuitry can be selected for low, medium or high light levels.

The peripheral user interface 232, which includes the shutter button, may further include one or more additional input devices (e.g., for settings, controls and/or input of other information), one or more output devices, (e.g., a display for output of images or other information) and associated electronics.

The electronic image storage media 220, power supply 224, peripheral user interface 232, circuit board 236, housing 240, shutter assembly (not shown), and aperture 250, may be, for example, similar to the electronic image storage media 120, power supply 124, peripheral user interface 132, circuit board 136, housing 140, shutter assembly (not shown), and aperture 150 of the digital camera 100 described above.

Figure 3:
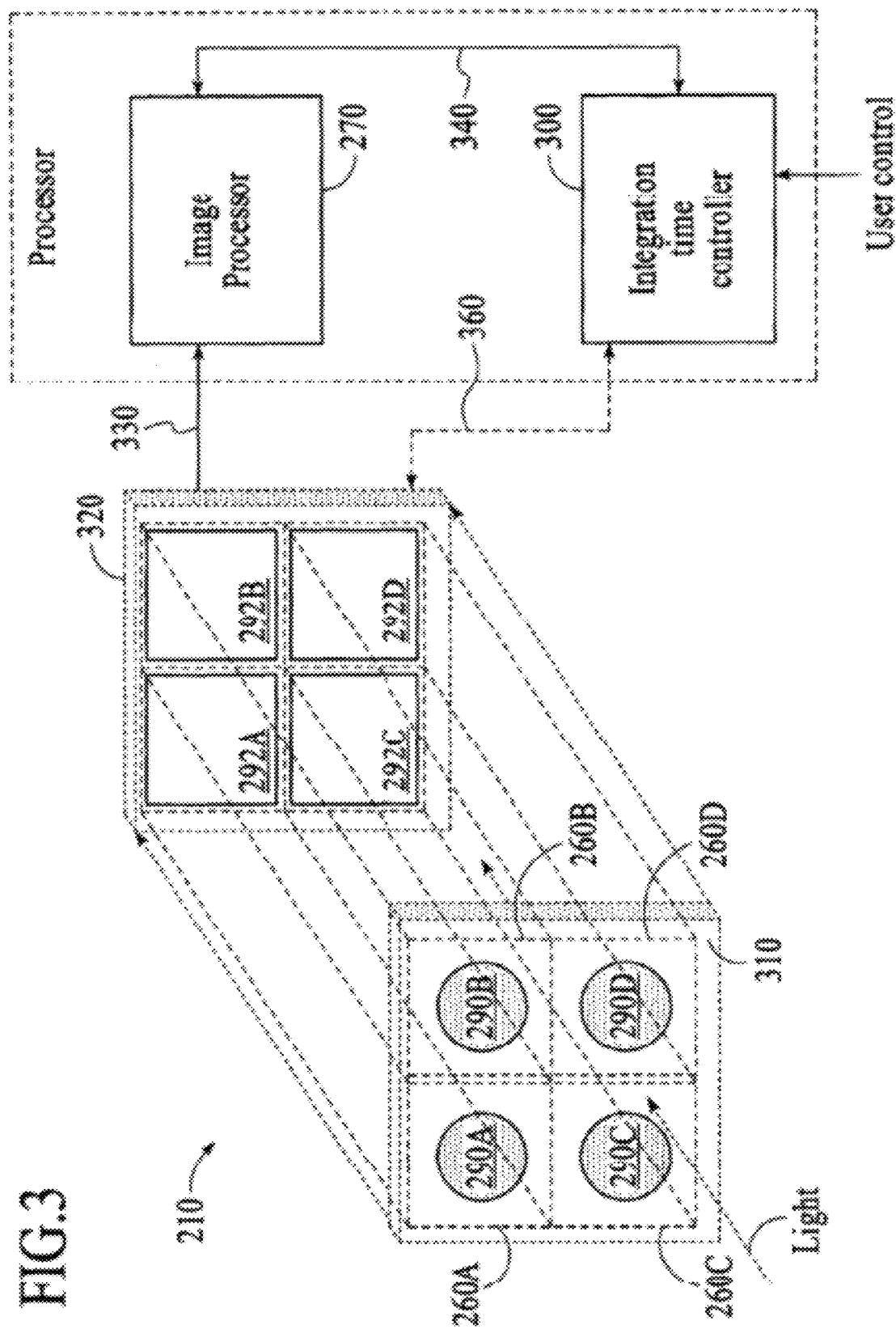
FIG. 3 is a block diagram of a digital camera subsystem, under an embodiment.

FIG. 3 is a block diagram of a digital camera subsystem 210, under an embodiment. As described above, the subsystem 210 includes one or more camera channels. The digital camera subsystem 210 for example is a four channel signal integration time control system (e.g., four camera channels 260A-260D), but the embodiment is not limited to four channels and can include any number of camera channels. Each of the camera channels 260A-260D includes an optics component or portion and a sensor component or portion. The optics component can have different optical f-number among the included camera channels but is not so limited. For example, camera channel 260A includes an optics portion 290A and a sensor portion 292A. Camera channel B includes an optics portion 290B and a sensor portion 292B. Camera channel C includes an optics portion 290C and a sensor portion 292C. Camera channel D includes an optics portion 290D and a sensor portion 292D. The optics portions of the one or more camera channels are collectively referred to herein as an optics subsystem. The sensor portions of the one or more camera channels are collectively referred to herein as a sensor subsystem. Each camera channel has a selectable integration, and the integration time setting between channels is selected to cover a range of incident light level onto the digital camera.

In the digital camera subsystem 210, each channel can have the same configuration or a different configuration relative to at least one other channel of the subsystem 210. For example, in some embodiments, the camera channels are all identical to one another. In some other embodiments, one or more of the camera channels are different, in one or more respects, from one or more of the other camera channels. In some of the latter embodiments, each camera channel may be used to detect a different color (or band of colors) and/or band of light than that detected by the other camera channels. For example, in some embodiments, one of the camera channels (e.g., camera channel 260A) detects red light, one of the camera channels (e.g., camera channel 260B) detects green light, and one of the camera channels (e.g., camera channel 260C) detects blue light; any other color combinations can also be used. The color detection capability can be provided by optical materials, color filter layers over the detector, and/or color separation mechanisms built into the photo-detector structure.

Thus, the optics portions can each be the same or different relative to other optics portions. In some embodiments, all optics portions are identical. In some other embodiments, one or more of the optics portions are different, in one or more respects, from one or more of the other optics portions. For example, in some embodiments, one or more of the characteristics (for example, but not limited to, its type of element(s), size, and/or performance) of one or more of the optics portions is tailored to the respective sensor portion and/or to help achieve a desired result. For example, if a particular camera channel is dedicated to a particular color (or band of colors) or wavelength (or band of wavelengths) then the optics portion for that camera channel may be adapted to transmit only that particular color (or band of colors) or wavelength (or band of wavelengths) to the sensor portion of the particular camera channel and/or to filter out one or more other colors or wavelengths.

Similar to the optics portion, if the digital camera subsystem 210 includes more than one sensor portion, configurations of the sensor portions can be the same or different relative to one or more other sensor portions. In some embodiments, the sensor portions are similar or identical to the other sensor portions. In some other embodiments, one or more of the sensor portions are different, in one or more respects, from one or more of the other sensor portions. In some embodiments, for example, one or more of the characteristics (for example, but not limited to, its type of element(s), size, and/or performance) of one or more of the sensor portions is tailored to the respective optics portion and/or to help achieve a desired result. For example, if a particular camera channel is dedicated to a particular color (or band of colors) or wavelength (or band of wavelengths) then the sensor portion for that camera channel may be adapted to have a sensitivity that is higher to that particular color (or band of colors) or wavelength (or band of wavelengths) than other colors or wavelengths and/or to sense only that particular color (or band of colors) or wavelength (or band of wavelengths). The sensor portion for that camera may be adapted for optimized operation by features such as array size, pixel size, pixel design, image sensor design, image sensor integrated circuit process and electrical circuit operation.

The digital camera subsystem 210 further includes a processor. The processor includes an image processor portion 270 (referred to as image processor 270) and an integration time controller portion 300 (referred to as controller 300). The controller is a component of the variable integration time that provides integration time control for each of the camera channels. The processor 270 is coupled or connected to the one or more sensor portions (e.g., sensor portions 292A-292D) via one or more communication couplings or links, represented by a signal line 330. A communication link may be any kind of communication link including but not limited to, for example, wired (e.g., conductors, fiber optic cables) links, wireless links (e.g., acoustic links, electromagnetic links, and/or any combination of links including but not limited to microwave links, satellite links, infrared links), and/or combinations of wired and/or wireless links.

The operation of the digital camera subsystem 210 is described below. For example, the user selects a desired incident light range and the camera automatically adjusts the integration time setting between the camera channels to give an optimal dynamic range result. Alternatively the user can select an integration time for each camera channel. An optics portion of a camera channel receives light from within a field of view and transmits one or more portions of such light. The sensor portion receives one or more portions of the light transmitted by the optics portion and, in response, generates an output signal representative or indicative of information of the received light. The output signal from the sensor portion is coupled to the image processor 270 which, as is further described below, can generate an image based at least in part on the output signal from the sensor.

When the digital camera subsystem 210 includes more than one camera channel, the image processor 270 generates a combined image based at least in part on the images from two or more of the camera channels. For example, in an embodiment, each of the camera channels is dedicated to a different color (or band of colors) or wavelength (or band of wavelengths) relative to the other camera channels, and the image processor 270 combines the images from the two or more camera channels to provide a full-color large dynamic range image. In other embodiments, all camera channels provide the same color capability (such as RGB Bayer patterns on each color channel) and the image processor 270 combines the camera channels to create a large dynamic range image.

The image processor 270 can also combine sensor channels and analyze the resultant image on a frame by frame basis. The image processor 270 can send a signal to the integration time controller 300 for real-time, or near real-time, dynamic range management by adjustment of each channel's integration time control. This same method can be used to optimize a subsequent single field exposure for optimal picture taking.

In the digital camera subsystem 210 of an embodiment, the four camera channels 260A-260D are configured to detect RGB light. Each of the camera channels can be identical in configuration or optimized for a specified light level as described above; for example if camera channel 260A is intended to detect dim light the optics f-number in that channel could be reduced. The pixel photo-detector can be configured for low dark current and the pixel circuitry configured for low noise. The integration time control on camera channel 260A is increased to allow increased signal collection. Some pixels in channel 260A would saturate due to incident light levels; this would be determined electrically and data from those pixels would not be used in creating a composite image. Channels 260B-260D would be configured and operated in a similar fashion to sense larger incident light levels.

In the digital camera subsystem 210 of another alternative embodiment, the four camera channels 260A-260D are configured to provide different imaging capability; for example channel 260A is configured to detect red and blue light, while channel 260B is configured to detect green light. The combined response from channels 260A and 260B of this embodiment thus comprises a RGB color camera. The integration time settings for channels 260A and 260B are configured or set for low incident light levels. Camera channel 260C is configured to collect red and blue light and channel 260D is configured to collect green light. The combined images of channels 260C and 260D generate a second RGB imaging capability and the integration time of channels 260C and 260D is configured for high incident light levels.

In the digital camera subsystem 210 of yet another alternative embodiment, camera channel 260A is configured for red light, camera channel 260B is configured for green light, and camera channel 260C is configured for blue light. Camera channels of a single color can provide superior low light response since the color transmission with each channel is high (high transmission color filters within the optical path) and the photo-detection mechanism in each camera channel is configured or set for a specific color for high responsivity. The combined response from channels 260A, 260B and 260C thus comprises a RGB color camera. The integration time settings for channels 260A, 260B and 260C are configured for low incident light levels. Camera channel 260D is configured for RGB light detection and the integration time of that channel configured or set for high incident light levels. Various other combinations of integration times among the channels are possible under the description herein.

Figure 4:
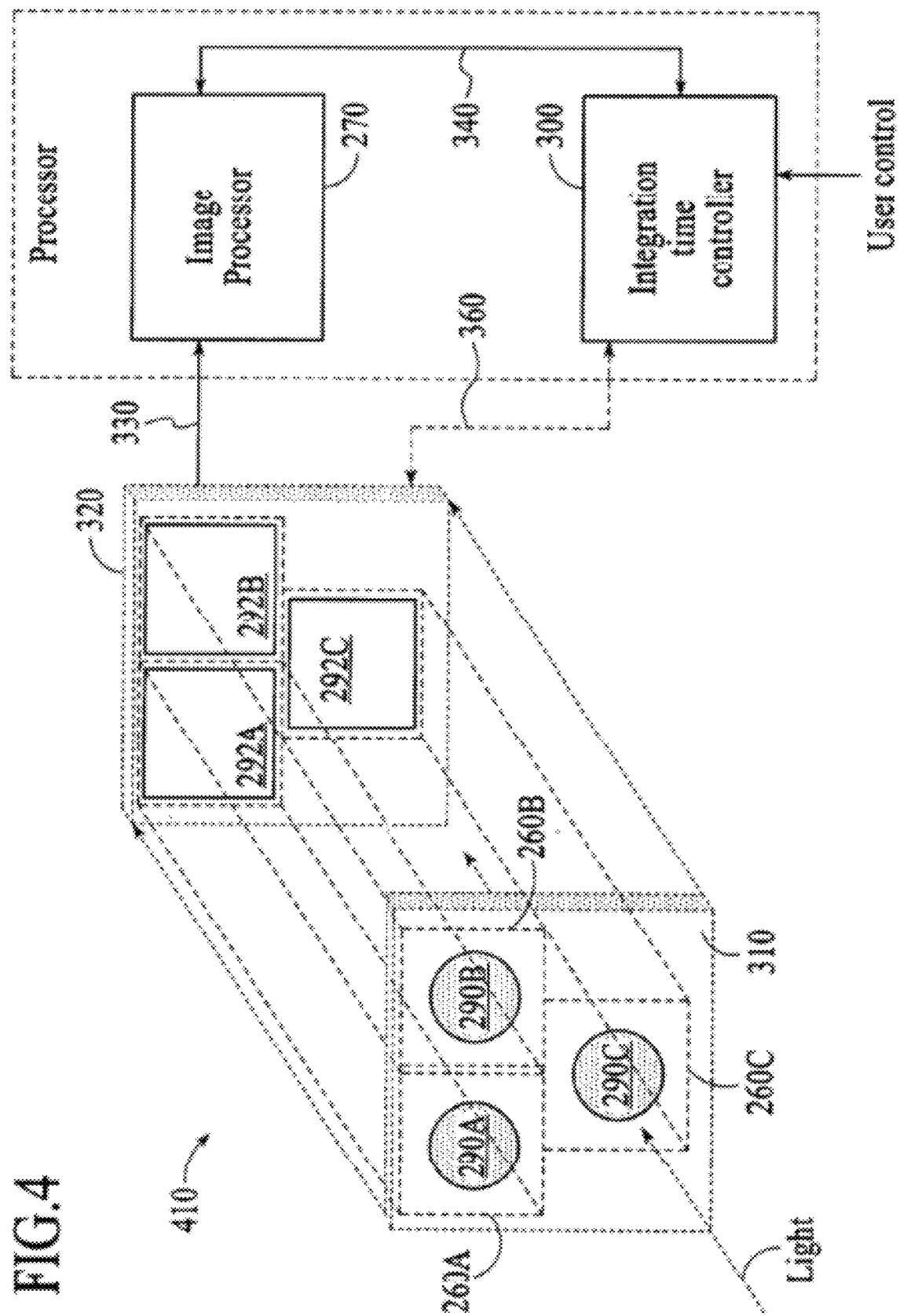
FIG. 4 is a digital camera subsystem, under an alternative embodiment.

FIG. 4 is a digital camera subsystem 410, under an alternative embodiment. The digital camera subsystem 410 for example is a three channel signal integration time control system (e.g., three camera channels 260A-260C), but the embodiment is not limited to three channels and can include any number of camera channels. The digital camera subsystem 410 includes camera channel 260A configured for RGB light, camera channel 260B configured for RGB light, and camera channel 260C configured for RGB light. The integration time of camera channel 260A is configured for low light, the integration time of camera channel 260B is configured for medium high, and the integration time of camera channel 260C is configured for high incident light levels. The combined response from camera channels 260A, 260B and 260C provides a large dynamic range imaging capability.

The digital camera subsystem 410 of one alternative configuration is a three channel system in which camera channel 260A is configured for RGB light, camera channel 260B is configured for RGB light, and camera channel 260C is configured for RGB light. The integration time of camera channel 260A is configured for medium light, the integration time of camera channel 260B is configured for medium high, and the integration time of camera channel 260C is configured for high incident light levels. The combined response from camera channels 260A, 260B and 260C provides a large dynamic range imaging capability. Various other combinations of integration times among the channels are possible under the description herein.

While the triangular layout configuration of the three camera channels 260A-260C can provide area reduction advantages in imager layout and processing on semiconductor wafers, and can provide optical symmetry between the channels, alternative layout configurations are possible using the three camera channels. For example, one alternative layout includes a 1 by 3 vertical configuration. Another alternative layout includes a 1 by 3 horizontal configuration.

Figure 5:
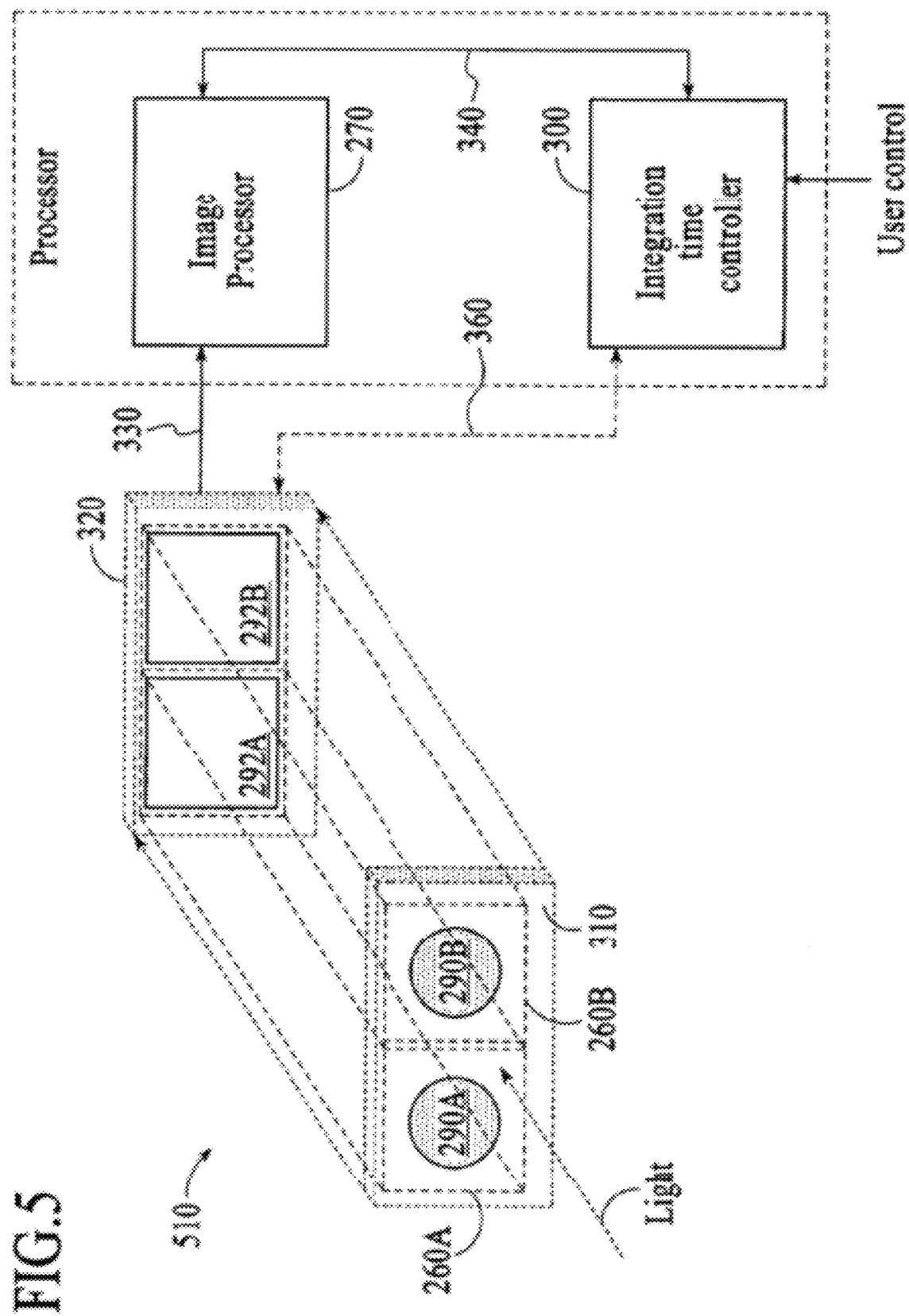
FIG. 5 is a digital camera subsystem, under another alternative embodiment.

FIG. 5 is a digital camera subsystem 510, under another alternative embodiment. The digital camera subsystem 510 for example is a two channel signal integration time control system (e.g., two camera channels 260A-260B), but the embodiment is not limited to two channels and can include any number of camera channels. The digital camera subsystem 510 includes camera channel 260A configured for RGB light and camera channel 260B configured for RGB light. The integration time of camera channel 260A is configured or set for low light and camera channel 260B is configured for high incident light levels. The combined response from camera channels 260A and 260B provides a large dynamic range imaging capability. Alternative configurations of the two camera channels include a 1 by 2 vertical layout and a 1 by 2 diagonal layout of camera channels.

The digital camera subsystem 510 of one alternative configuration is a two channel system in which camera channel 260A is configured for RGB light and camera channel 260B is configured for RGB light. The integration time of camera channel 260A is configured or set for low light and camera channel 260B is configured for medium incident light levels. The combined response from camera channels 260A and 260B provides a large dynamic range imaging capability.

The digital camera subsystem 510 of another alternative configuration is a two channel system in which camera channel 260A is configured for RGB light and camera channel 260B is configured for RGB light. The integration time of camera channel 260A is configured or set for medium light and camera channel 260B is configured for high incident light levels. The combined response from camera channels 260A and 260B provides a large dynamic range imaging capability. Various other combinations of integration times among the channels are possible under the description herein.

Figure 6:
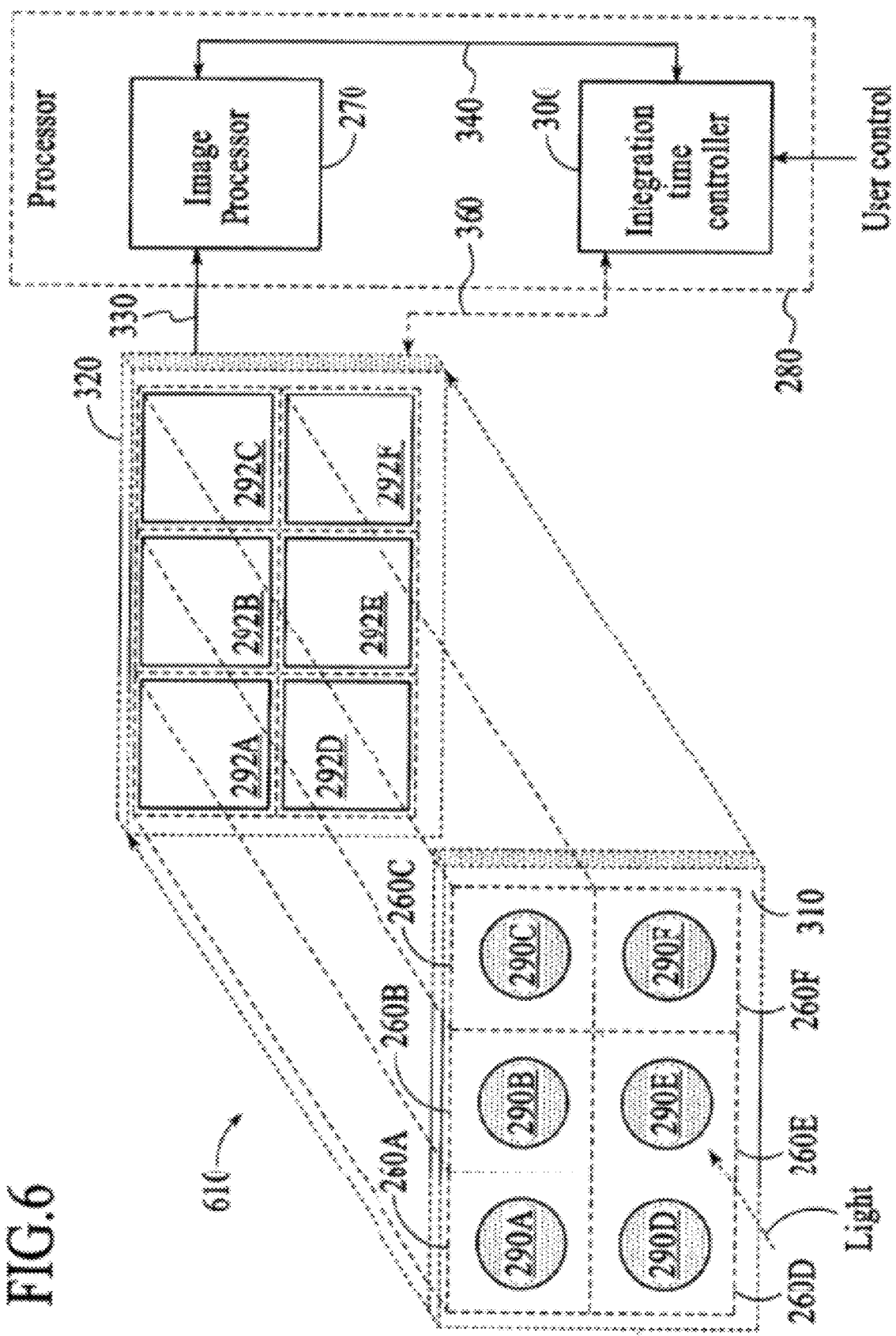
FIG. 6 is a digital camera subsystem, under still another alternative embodiment.

FIG. 6 is a digital camera subsystem 610, under still another alternative embodiment. The digital camera subsystem 610 is a six channel signal integration time control system (e.g., six camera channels 260A-260F), but the embodiment is not limited to six channels and can include any number of camera channels. The digital camera subsystem 610 includes camera channel 260A configured for incident red light, camera channel 260B configured for green light, and camera channel 260C configured for blue light. The combined response from camera channels 260A, 260B and 260C provides a first RGB color camera. The integration time settings for camera channels 260A, 260B and 260C are configured for low incident light levels.

The digital camera subsystem 610 also includes camera channel 260D configured for incident red light, camera channel 260E configured for green light, and camera channel 260F configured for blue light. The combined response from camera channels 260D, 260E and 260F provides a second RGB color camera. The integration time settings for camera channels 260D, 260E and 260F are configured for high incident light levels.

Figure 7:
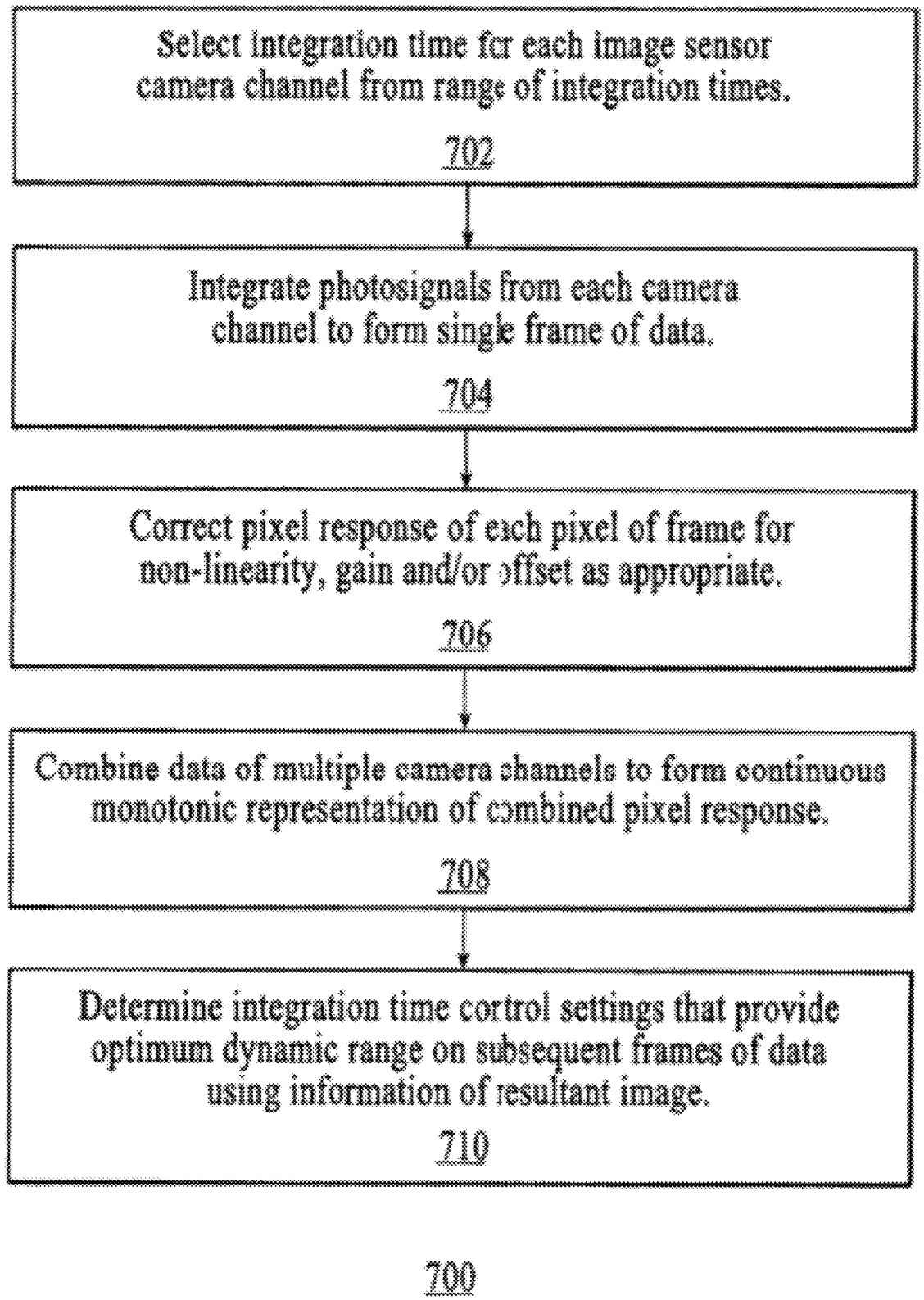
FIG. 7 is a block diagram of a method for forming images having a large dynamic range, under an embodiment.

The digital camera system described above includes a method for forming images having a large dynamic range. FIG. 7 is a block diagram for forming images 700 having a large dynamic range, under an embodiment. The method for forming images 700 can be implemented using the image processor 270 and/or the 300 integration time controller as described above with reference to FIGS. 3-6. The method of an embodiment includes selecting 702 an integration time for each image sensor camera channel from a range of integration times. The photo-signal from each camera channel is integrated 704 within a single frame of data, and the resultant photo-charge for each pixel is stored within that pixel. The photo-signal is read from each pixel and each pixel response is corrected 706 for one or more of non-linearity, gain and offset as appropriate and/or required. The method combines 708 data of the multiple camera channels, and thus provides a continuous monotonic representation of the combined pixel response from low to high incident light levels. The method of an embodiment includes processing (e.g. post-processing), storing, displaying and/or outputting the resultant large dynamic range image from the combined camera channels. Information of the resultant image and/or any post-processing operations is used to determine integration time control settings 710 that provide optimum dynamic range on subsequent frames of data but is not so limited.

Figure 8:
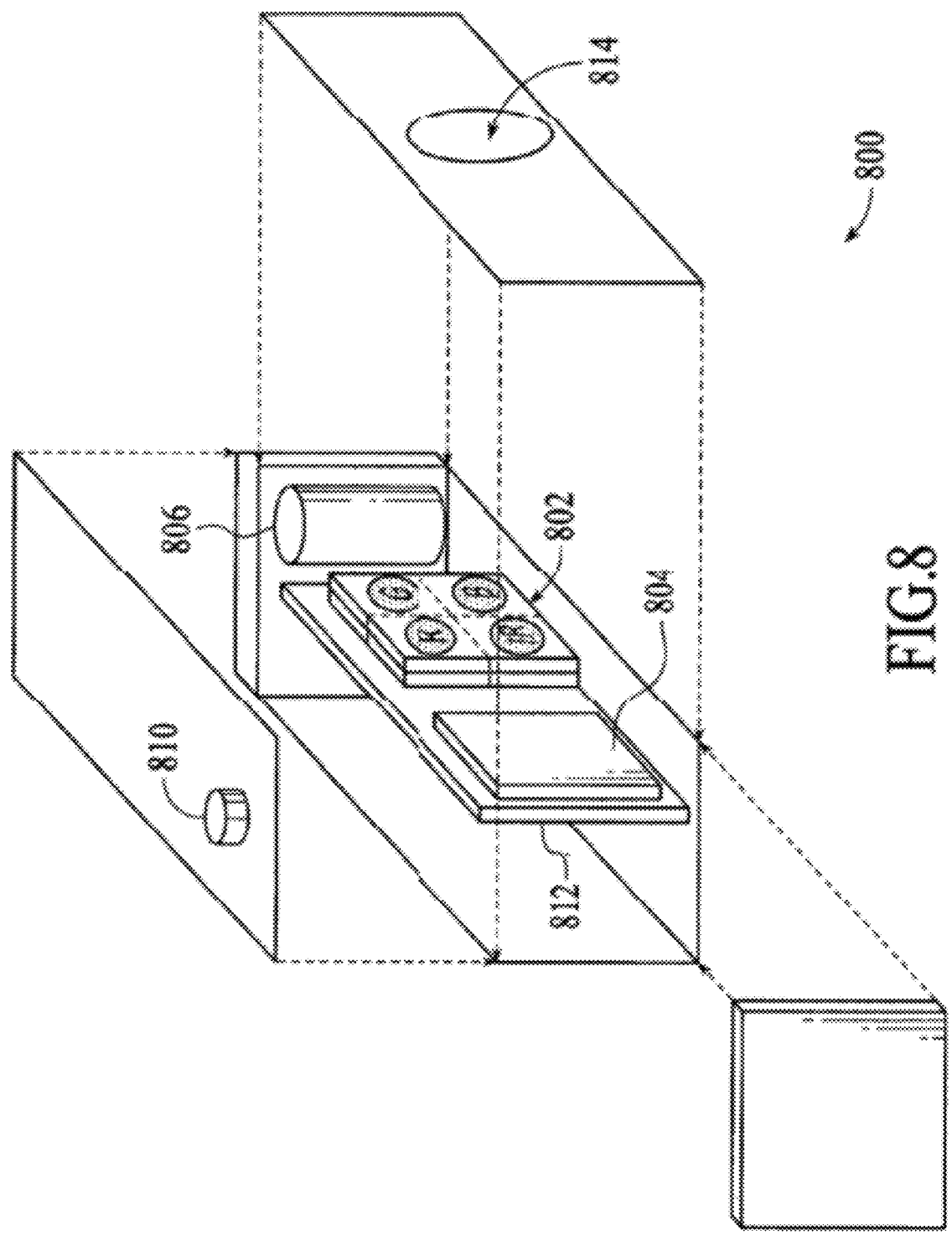
FIG. 8 is a block diagram of a digital camera, under an embodiment.

FIGS. 8-21 illustrate further examples of apparatus and systems in which the imaging module and focusing method embodiments disclosed above can be implemented. FIG. 8 is a block diagram of a digital camera 800, under an embodiment. The digital camera includes a digital camera subsystem 802, a circuit board 812, a peripheral user interface electronics 810 (here represented as a shutter button, but could also include display and/or one or more other output devices, setting controls and/or one or more additional input devices etc), a power supply 806, and electronic image storage media 804. The digital camera 800 may further include a housing and a shutter assembly (not shown), which controls an aperture 814 and passage of light into the digital camera 800.

Figure 9:
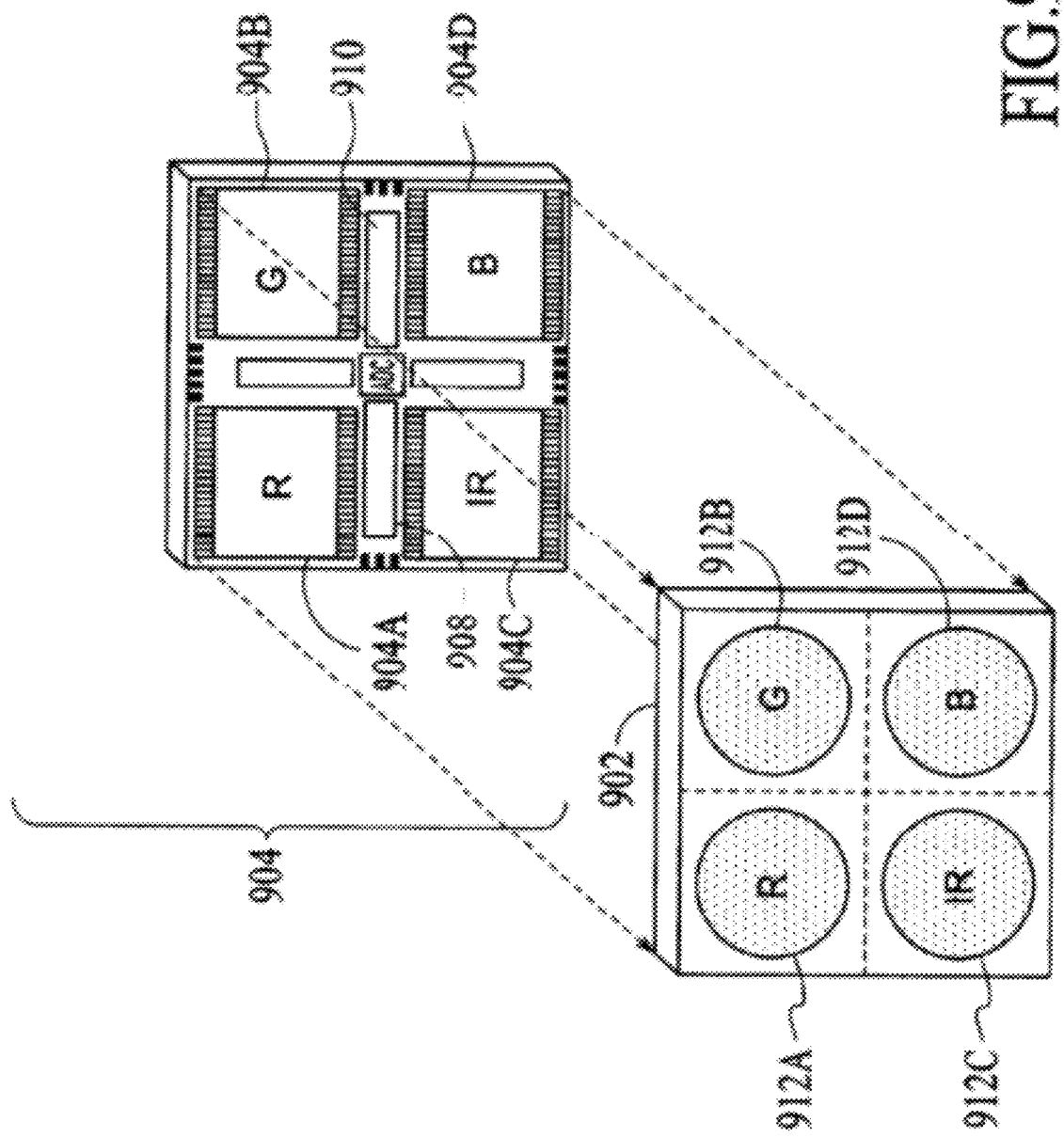
FIG. 9 is an exploded view of a digital camera subsystem, under an embodiment.

FIG. 9 is an exploded view of the digital camera subsystem 802, under an embodiment. In this embodiment, the digital camera subsystem includes an image sensor 904, an optics frame (also referred to as a frame) 902, and lenses 912A-912D. The frame 902 is used to mount the lenses 912A-912D to the image sensor 904. The image sensor, or imager die 904 generally includes a semiconductor integrated circuit or "chip" having several higher order features including multiple arrays 904A-904D and signal processing circuits 908 and 910. Each of the arrays 904A-904D captures photons and outputs electronic signals. The signal processing circuit 908, in certain embodiments, processes signals for each of the individual arrays 904. The signal processing circuit 910 may combine the output from signal processing 908 into output data (usually in the form of a recombined full color image). Each array and the related signal processing circuitry may be tailored to address a specific band of visible spectrum.

Each of lenses 912A-912D may be tailored for the respective wavelength of the respective array. Lenses are approximately the same size as the underlying array 904, and will differ from one another in size and shape depending upon the dimensions of the underlying array. In alternative embodiments a lens could cover only a portion of an array, and could extend beyond the array. Lenses can comprise any suitable material or materials, including for example, glass and plastic. Lenses can be doped in any suitable manner, such as to impart a color filtering, polarization, or other property. Lenses can be rigid or flexible.

In the example of FIG. 9, each lens, array, and signal processing circuit constitutes an image generating subsystem for a band of visible spectrum (e.g., red, blue, green, etc). These individual images are then combined with additional signal processing circuitry within the semiconductor chip to form a full image for output.

Figure 10:
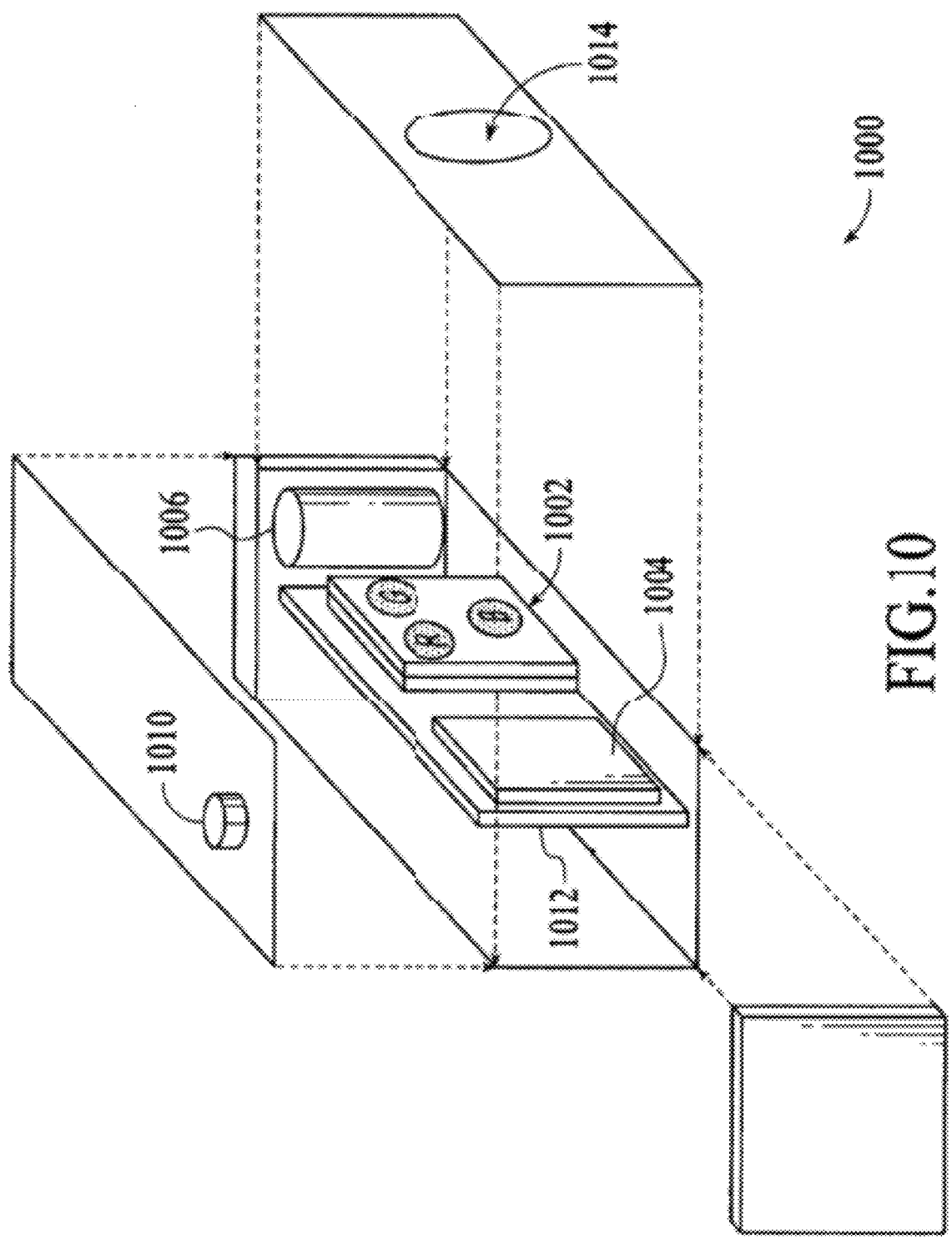
FIG. 10 is a block diagram of a digital camera having a three array/lens configuration, under an embodiment.

Although the digital camera subsystem 904 is depicted in a four array/lens configuration, the digital camera subsystem can be employed in a configuration having any number of arrays/lenses and any combination of shapes of arrays/lenses. FIG. 10 is a block diagram of a digital camera 1000 having a three array/lens configuration, under an embodiment. The digital camera 1000 includes a digital camera subsystem 1002 that includes three lenses. The digital camera 1000 further includes a circuit board 1012, a peripheral user interface electronics 1010 (here represented as a shutter button, but could also include display and/or one or more other output devices, setting controls and/or one or more additional input devices etc), a power supply 1006, and electronic image storage media 1004. The digital camera 1000 may further include a housing and a shutter assembly (not shown), which controls an aperture 1014 and passage of light into the digital camera 1000.

Figure 11:
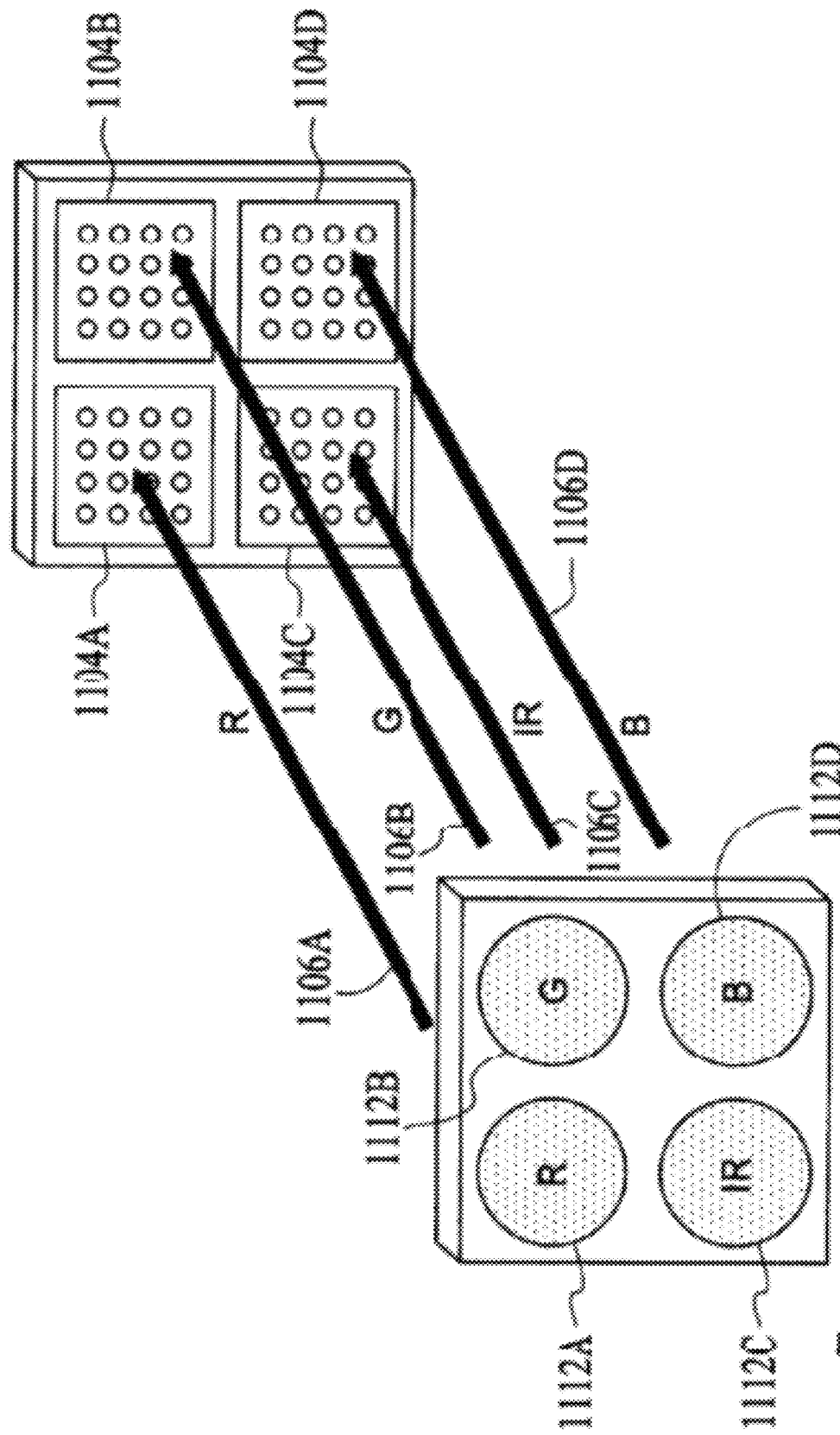
FIG. 11 is a block diagram of a digital camera subsystem that employs separate arrays on one image sensor, under an embodiment.

FIG. 11 is a block diagram of a digital camera subsystem that employs separate arrays, e.g., arrays 1104A-1104D, on one image sensor, in contrast to the prior art. For example, typical prior art approaches employ a Bayer pattern (or variations thereof), perform operations across the array (a pixel at a time), and integrate each set of four pixels (for example, red/green/blue/green or variation thereof) from the array into a single full color pixel.

Each of the arrays 1104 focuses on a specific band of visible spectrum. Each lens only needs to pass a respective color (1106A-1106D) on to the image sensor. The traditional color filter sheet is eliminated. Each array 1104 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

As such, each array may be tuned to be more efficient in capturing and processing the image in that particular color. Individual lenses (1112A-D) can be tailored for the array's band of spectrum.

Figure 12:
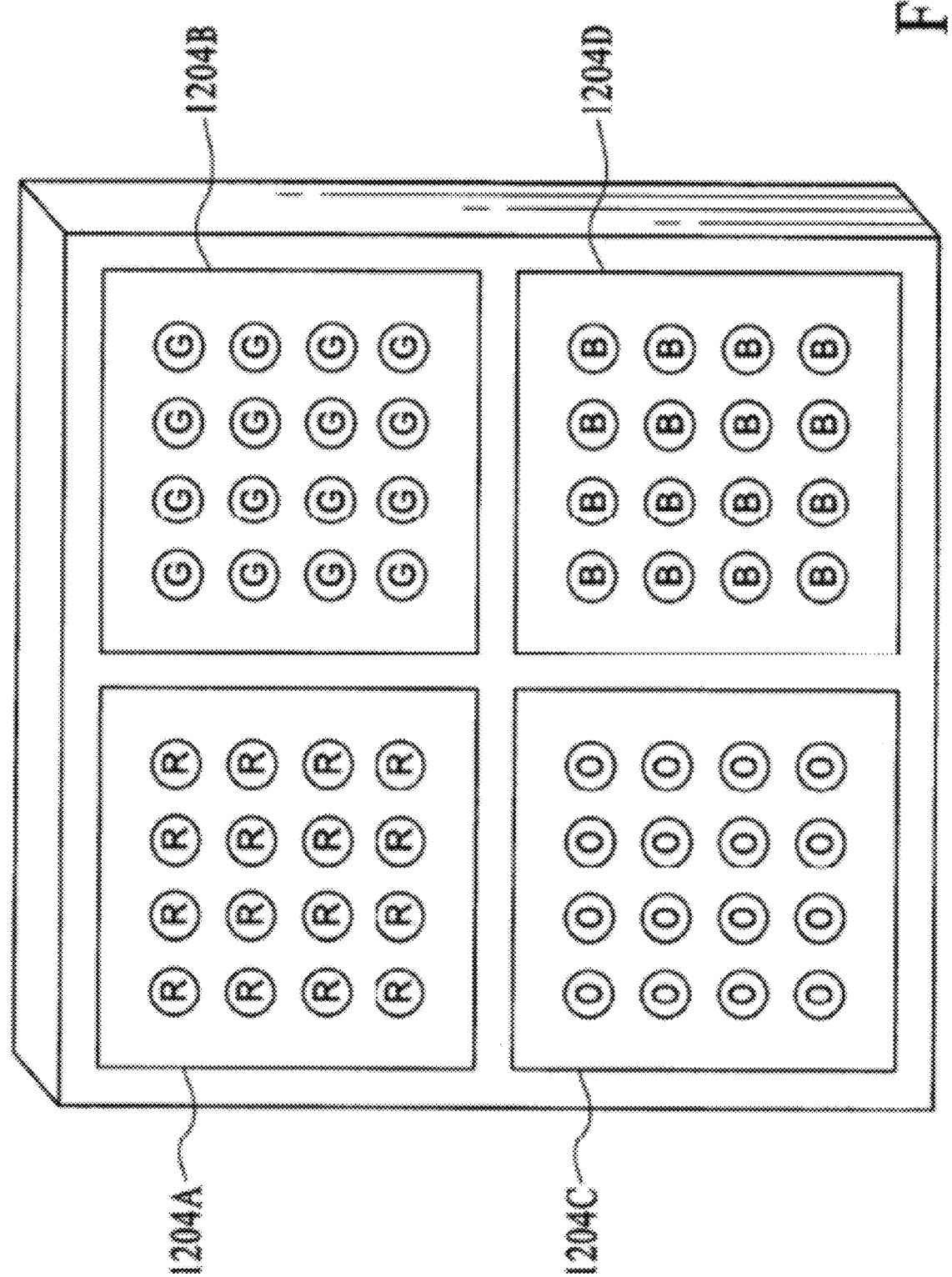
FIG. 12 is a block diagram of arrays, each of which receives a respective color as passed by a respective lens, under an embodiment.

FIG. 12 is a block diagram of arrays 1204A-1204D. Each array 1204 receives a respective color as passed by a respective lens. The traditional color filter sheet is eliminated. Each array 1204 outputs signals to signal processing circuitry. Signal processing circuitry for each of these arrays is also tailored for each of the bands of visible spectrum. In effect, individual images are created for each of these arrays. Following this process, the individual images are combined or to form one full color or black/white image. By tailoring each array and the associated signal processing circuitry, a higher quality image can be generated than the image resulting from traditional image sensors of like pixel count.

Figure 13:
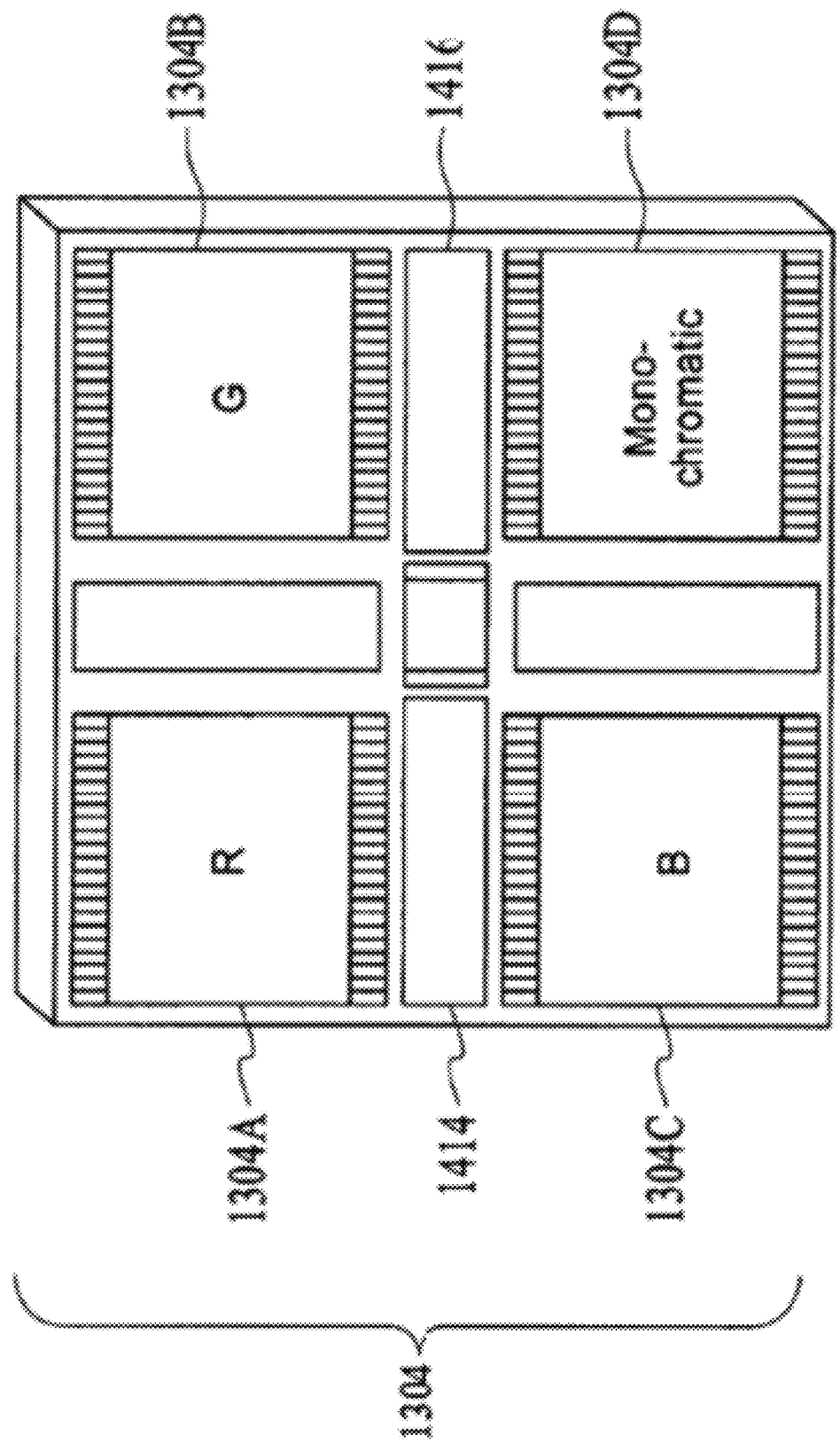
FIG. 13 is a block diagram of processing circuitry of a digital camera subsystem, under an embodiment.

FIG. 13 is a block diagram of processing circuitry of a digital camera subsystem, under an embodiment. FIG. 13 includes an array 1304, including arrays 1304A-1304D, and signal processing circuitry (also referred to as image processing circuitry) 1414 and 1416. Each array outputs signals to signal processing circuitry.

Figure 14:
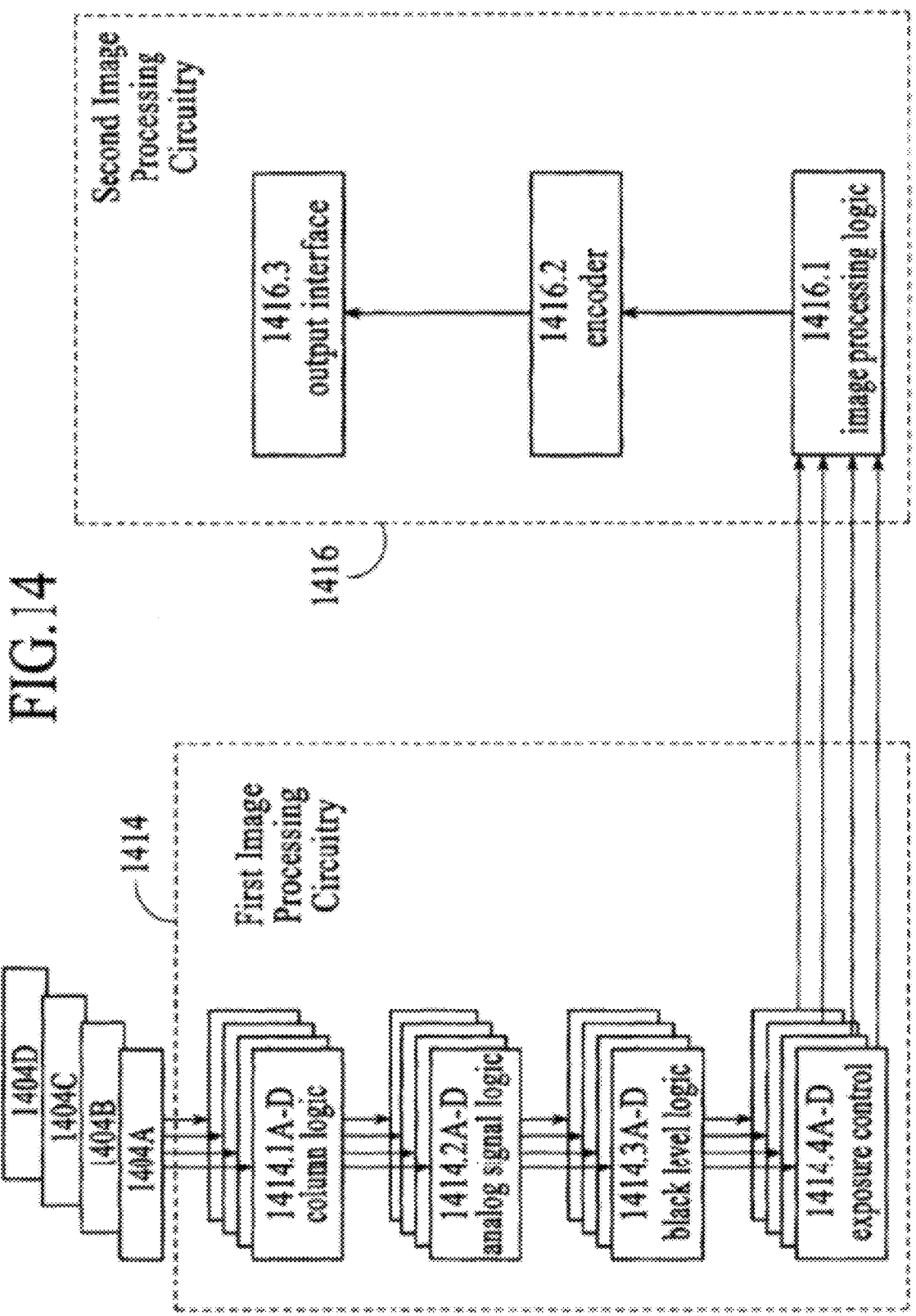
FIG. 14 is a block diagram of signal processing circuitry, under an embodiment.

FIG. 14 is a block diagram of image processing circuitry 1414 and 1416. Within the image processing circuitry 1414, each array can be processed separately to tailor the processing to the respective bands of spectrum.

Column logic 1414.1A-1414.1D is the portion of the signal processing circuitry that reads the signals from the pixels. For example, the column logic 1414.1A reads signals from the pixels in array 1404A. Column logic 1414.1B reads signals from the pixels in array 1404B. Column logic 1414.1C reads signals from the pixels in array 1404C. Column logic 1414.1D reads signals from the pixels in array 1404D.

Since an array is targeting a specific wavelength, wavelengths, band of wavelength, or band of wavelengths, the column logic may have different integration times for each array enhancing dynamic range and/or color specificity. Signal processing circuitry complexity for each array can be substantially reduced since logic may not have to switch between extreme color shifts.

Analog Signal Logic (ASL) 1414.2A-1414.2D for each array may be color specific. As such, the ASL processes a single color and therefore can be optimized for gain, noise, dynamic range, linearity, etc. Due to color signal separation, dramatic shifts in the logic and settling time are not required as the amplifiers and logic do not change on a pixel by pixel (color to color) basis as in traditional Bayer patterned designs.

Black level control 1414.3A-1414.3D assesses the level of noise within the signal, and filters it out. With each array focused upon a narrower band of visible spectrum than traditional image sensors, the black level control can be more finely tuned to eliminate noise.

Exposure control 1414.4A-1414.4D measures the overall volume of light being captured by the array and adjusts the capture time for image quality. Traditional cameras must make this determination on a global basis (for all colors). The embodiments describe herein allow for exposure control to occur differently for each array and targeted band of wavelengths.

These processed images are then passed to a second group of signal processing circuitry 1416. First, image processing logic 1416.1 integrates the multiple color planes into a single color image. The image is adjusted for saturation, sharpness, intensity, hue, artifact removal, and defective pixel correction.

In an embodiment, the final two operations include encoding the signal into standard protocols such as MPEG, JPEG, etc. in an encoder 1416.2 before passing the result to a standard output interface 1416.3, such as USB.

Although the signal processing circuitries 1414 and 1416 are shown at specific areas of the image sensor, the signal processing circuitries 1414 and 1416 can be placed anywhere on the chip and subdivided in any fashion. The signal processing circuitries are often placed in multiple locations.

As previously stated, the image sensor 1404 generally includes a semiconductor chip having several higher order features including multiple arrays (1404A-1404D), and signal processing circuitry 1414, in which each array and the related signal processing circuitry is preferably tailored to address a specific band of visible spectrum. As noted above, the image sensor array can be configured using any multiple numbers and shapes of arrays.

The image sensor 1404 can be constructed using any suitable technology, including silicon and germanium technologies. The pixels can be formed in any suitable manner, can be sized and dimensioned as desired, and can be distributed in any desired pattern. Pixels that are distributed without any regular pattern may also be used.

Any range of visible spectrum can be applied to each array depending on the specific interest of the customer. Further, an infrared array could also be employed as one of the array/lens combinations giving low light capabilities to the sensor.

As previously described, arrays 1404A-1404D may be of any size or shape. While some figures referenced herein show the arrays as individual, discrete sections of the image sensor, these arrays may also be touching. There may also be one large array configured such that the array is subdivided into sections, and each section is focused upon one band of spectrum, creating the same effect as separate arrays on the same chip.

Although the well depth of the photo detectors across each individual array 1404 may be the same, the well depth of any given array may be different from that of other arrays of the sensor subsystem. A photo detector includes an area or portion of the photo detector that captures, collects, is responsive to, detects and/or senses the intensity illumination of incident light. In some embodiments, the well depth is the distance from the surface of the photo detector to a doped region.

Selection of an appropriate well depth depends on many factors, including the targeted band of visible spectrum. Since each entire array is likely to be targeted at one band of visible spectrum (e.g., red) the well depth can be configured to capture that wavelength and ignore others (e.g., blue, green). Doping of the semiconductor material in the color specific arrays can further be used to enhance the selectivity of the photon absorption for color-specific wavelengths.

In various embodiments, a digital camera subsystem can have multiple separate arrays on a single image sensor, each with its own lens. The simple geometry of smaller, multiple arrays allows for a smaller lenses (e.g., smaller diameter, thickness and focal length), which allows for reduced stack height in the digital camera.

The lens and frame concept is applicable to traditional image sensors (without the traditional color filter sheet) to gain physical size, cost and performance advantages.

Each array can advantageously be focused on one band of visible and/or detectable spectrum. Among other things, each lens may be tuned for passage of one specific band of wavelength. Since each lens would therefore not need to pass the entire light spectrum, the number of elements may be reduced, for example, to one or two.

Further, due to the focused bandwidth for each lens, each of the lenses may be dyed during the manufacturing process for its respective bandwidth (e.g., red for the array targeting the red band of visible spectrum). Alternatively, a single color filter may be applied across each lens. This process eliminates the traditional color filters (such as the sheet of individual pixel filters) thereby reducing cost, improving signal strength and eliminating the pixel reduction barrier.

The above-described devices can include any suitable number of combinations, including as few as two arrays/lenses, and many more than two arrays/lenses. Examples include: two arrays/lenses configured as red/green and blue;

two arrays/lenses configured as red and blue/green; two arrays/lenses configured as red, green, blue; four arrays/lenses configured as red, blue, green, emerald (for color enhancement); four arrays/lenses configured as red, blue, green, infrared (for low light conditions); and eight arrays/lenses configured as double the above configurations for additional pixel count and image quality.

The cameras or camera subsystems described herein are intended to be emblematic of a generic appliance containing the digital camera subsystem. Thus, the description herein should be interpreted as being emblematic of still and video cameras, cell phones, other personal communications devices, surveillance equipment, automotive applications, computers, manufacturing and inspection devices, toys, plus a wide range of other and continuously expanding applications. Of course these alternative interpretations may or may not include the specific components as depicted herein. For example, the circuit board may not be unique to the camera function but rather the digital camera subsystem may be an add-on to an existing circuit board, such as in a cell phone.

Any or all of the methods and/or apparatus disclosed herein may be employed in any type of apparatus or process including, but not limited to still and video cameras, cell phones, other personal communications devices, surveillance equipment, automotive applications, computers, manufacturing and inspection devices, toys, plus a wide range of other and continuously expanding applications.

Although each array and the related signal processing circuitry is can be tailored to address a specific band of visible spectrum, and each lens may be tuned for passage of that one specific band of wavelength, there is no requirement that each such array and the related signal processing circuitry be tailored to address a specific band of the visible spectrum. Nor is there any requirement that each lens be tuned for passage of a specific band of wavelength or that each of the arrays be located on the same semiconductor device. Indeed, the embodiments described and illustrated herein, including the specific components thereof, need not employ wavelength-specific features. For example, the arrays and/or signal processing circuitry need not be tailored to address a specific wavelength or band of wavelengths.

Figure 15:
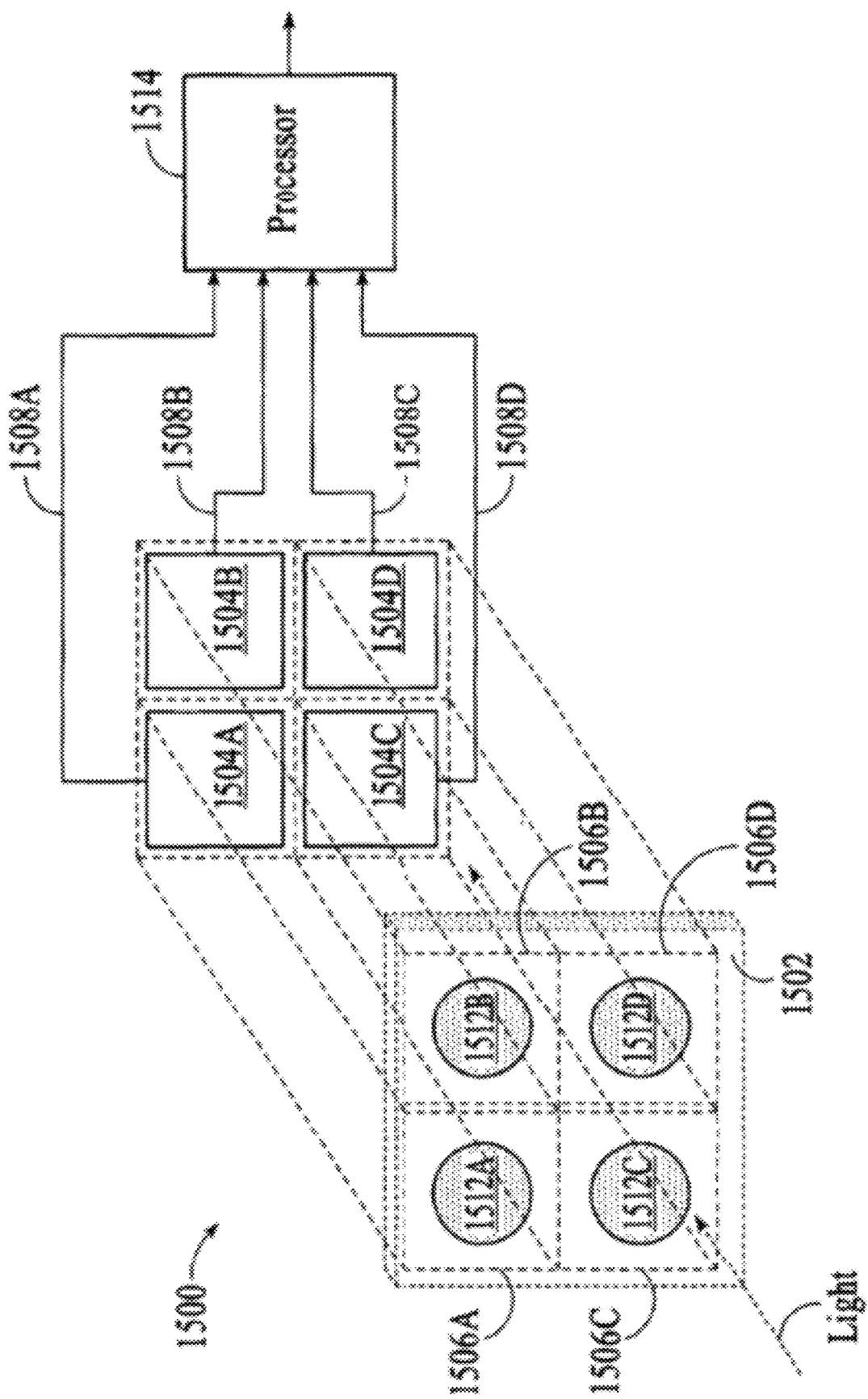
FIG. 15 is an exploded perspective view of a digital camera, under an embodiment.

FIG. 15 is an exploded perspective view of a digital camera 1500, under an embodiment. The digital camera apparatus 1500 includes one or more sensor arrays, e.g., four sensor arrays 1504A-1504D, and one or more optics portions, e.g., four optics portions 1512A-1512D. Each of the optics portions 1504A-1504D may include a lens, and may be associated with a respective one of the sensor arrays sensor arrays 1504A-1504D. In some embodiments a support 1502, for example a frame, is provided to support the one or more optics portions 1512A-1512D, at least in part. Each sensor array and the respective optics portion may define an optical channel. For example, an optical channel 1506A may be defined by the optics portion 1512A and the sensor array 1504A. An optical channel 1506B may be defined by the optics portion 1512B and the sensor array 1504B. An optical channel 1506C may be defined by optics portion 1512C and the sensor array 1504C. An optical channel 1506D may be defined by optics portion 1512D and a sensor array 1504D. The optics portions of the one or more optical channels are also collectively referred to as an optics subsystem.

The sensor arrays of the one or more optical channels are collectively referred as a sensor subsystem. The two or more sensor arrays may be integrated in or disposed on a common substrate, referred to as an image device, on separate substrates, or any combination thereof. For example, where the system includes three or more sensor arrays, two or more sensor arrays may be integrated in a first substrate, and one or more other sensor arrays may be integrated in or disposed on a second substrate.

In that regard, the one or more sensor arrays 1504A-1504D, may or may not be disposed on a common substrate. For example, in some embodiments two or more of the sensor arrays are disposed on a common substrate. In some embodiments, however, one or more of the sensor arrays is not disposed on the same substrate as one or more of the other sensor arrays. The one or more optical channels may or may not be identical to one another.

In some embodiments, one of the optical channels 1506 detects red light, one of the optical channels 1506 detects green light, and one of the optical channels 1506 detects blue light. In some of such embodiments, one of the optical channels 1506 detects infrared light, cyan light, or emerald light. In some other embodiments, one of the optical channels 1506 detects cyan light, one of the optical channels 1506 detects yellow light, one of the optical channels 1506 detects magenta light and one of the optical channels 1506 detects clear light (black and white). Any other wavelength or band of wavelengths (whether visible or invisible) combinations can also be used.

A processor 1514 is coupled to the one or more sensor arrays 1504A-1504D, via one or more communication links, e.g., communication links 1508A-1508D, respectively. A communication link may be any kind of communication link including but not limited to, for example, wired (e.g., conductors, fiber optic cables) or wireless (e.g., acoustic links, electromagnetic links or any combination thereof including but not limited to microwave links, satellite links, infrared links), and combinations thereof, each of which may be public or private, dedicated and/or shared (e.g., a network). A communication link may include for example circuit switching or packet switching or combinations thereof. Other examples of communication links include dedicated point-to-point systems, wired networks, and cellular telephone systems. A communication link may employ any protocol or combination of protocols including but not limited to the Internet Protocol.

The communication link may transmit any type of information. The information may have any form, including, for example, but not limited to, analog and/or digital) e.g., a sequence of binary values, or a bit string). The information may or may not be divided into blocks. If divided into blocks, the amount of information in a block may be predetermined or determined dynamically, and/or may be fixed (e.g., uniform) or variable.

As will be further described hereinafter, the processor may include one or more channel processors, each of which is coupled to a respective one (or more) of the optical channels and generates an image based at least in part on the signal(s) received from the respective optical channel, although this is not required. In some embodiments, one or more of the channel processors is tailored to its respective optical channel, for example, as described herein. For example, when one of the optical channels is dedicated to a specific wavelength or color (or band of wavelengths or colors) the respective channel processor may be adapted or tailored to such wavelength or color (or band of wavelengths or colors). Further, the gain, noise reduction, dynamic range, linearity and/or any other characteristic of the processor, or combinations of such characteristics, may be adapted to improve and/or optimize the processor to such wavelength or color (or band of wavelengths or colors). Tailoring the channel processing to the respective optical channel may facilitate generating an image of a quality that is higher than the quality of images resulting from traditional image sensors of like pixel count. In addition, providing each optical channel with a dedicated channel processor may help to reduce or simplify the amount of logic in the channel processors as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme.

In operation, an optics portion of a optical channel receives light from within a field of view and transmits one or more portions of such light, e.g., in the form of an image at an image plane. The sensor array receives one or more portions of the light transmitted by the optics portion and provides one or more output signals indicative thereof. The one or more output signals from the sensor array are supplied to the processor. In some embodiments, the processor generates one or more output signals based, at least in part, on the one or more signals from the sensor array. In some other embodiments, the processor may generate a combined image based, at least in part, on the images from two or more of such optical channels.

Although the processor 1514 is shown separate from the one or more sensor arrays 1504A-1504D, the processor 1514, or portions thereof, may have any configuration and may be disposed in one or more locations. For example, certain operations of the processor may be distributed to or performed by circuitry that is integrated in or disposed on the same substrate or substrates as one or more of the one or more of the sensor arrays and certain operations of the processor are distributed to or performed by circuitry that is integrated in or disposed on one or more substrates that are different from (whether such one or more different substrates are physically located within the camera or not) the substrates the one or more of the sensor arrays are integrated in or disposed on.

The digital camera apparatus 1500 may or may not include a shutter, a flash and/or a frame to hold the components together.

Figure 16B:
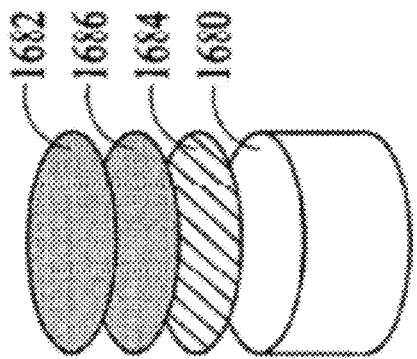
FIGS. 16A-16D are schematic exploded representations of one embodiment of an optics portion, under an embodiment.
Figure 16D:
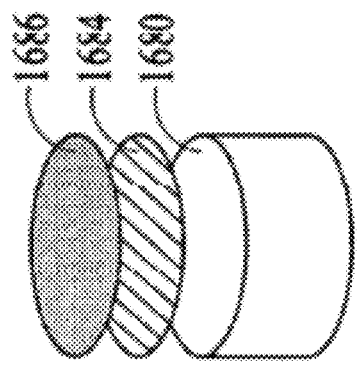
Figure 16A:
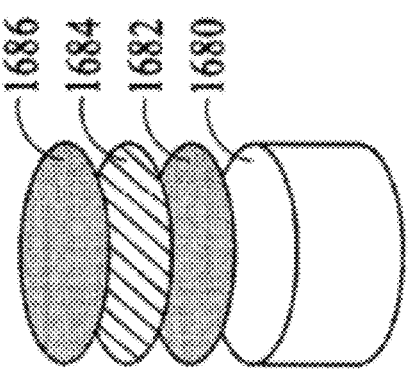

FIGS. 16A-16D are schematic exploded representations of one embodiment of an optics portion, such as optic portion 1512A, under an embodiment. In FIG. 16A, the optics portion 1512A includes one or more lenses, e.g., a complex aspherical lens module 1680, one or more color coatings, e.g., a color coating 1682, one or more masks, e.g., an auto focus mask 1684, and one or more IR coatings, e.g., an IR coating 1686.

Lenses can comprise any suitable material or materials, including for example, glass and plastic. Lenses can be doped in any suitable manner, such as to impart a color filtering, polarization, or other property. Lenses can be rigid or flexible. In this regard, some embodiments employ a lens (or lenses) having a dye coating, a dye diffused in an optical medium (e.g., a lens or lenses), a substantially uniform color filter and/or any other filtering technique through which light passes to the underlying array.

The color coating 1682 helps the optics portion filter (or substantially attenuate) one or more wavelengths or bands of wavelengths. The auto focus mask 1684 may define one or more interference patterns that help the digital camera apparatus perform one or more auto focus functions. The IR coating 1686 helps the optics portion 1512A filter a wavelength or band of wavelength in the IR portion of the spectrum.

The one or more color coatings, e.g., color coating 1682, one or more masks, e.g., mask 1684, and one or more IR coatings, e.g., IR coating 1686 may have any size, shape and/or configuration.

In some embodiments, as shown in FIG. 16B, one or more of the one or more color coatings, e.g., the color coating 1682, are disposed at the top of the optics portion. Some embodiments of the optics portion (and/or components thereof) may or may not include the one or more color coatings, one or more masks and one or more IR coatings and may or may not include features in addition thereto or in place thereof.

Figure 16C:
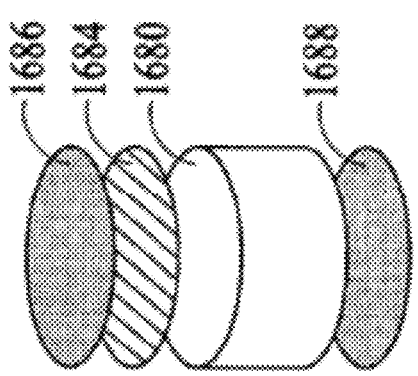

In some embodiments, as shown in FIG. 16C, one or more of the one or more color coatings, e.g., the color coating 1682, are replaced by one or more filters 1688 disposed in the optics portion, e.g., disposed below the lens. In other embodiments, as shown in FIG. 16D, one or more of the color coatings are replaced by one or more dyes diffused in the lens.

The one or more optics portions, e.g., optics portions 1512A-1512D of FIG. 15, may or may not be identical to one another. In some embodiments, for example, the optics portions are identical to one another. In some other embodiments, one or more of the optics portions are different, in one or more respects, from one or more of the other optics portions. For example, in some embodiments, one or more of the characteristics (for example, but not limited to, its type of element(s), size, response, and/or performance) of one or more of the optics portions is tailored to the respective sensor array and/or to help achieve a desired result. For example, if a particular optical channel is dedicated to a particular color (or band of colors) or wavelength (or band of wavelengths) then the optics portion for that optical channel may be adapted to transmit only that particular color (or band of colors) or wavelength (or band of wavelengths) to the sensor array of the particular optical channel and/or to filter out one or more other colors or wavelengths. In some of such embodiments, the design of an optical portion is optimized for the respective wavelength or bands of wavelengths to which the respective optical channel is dedicated. It should be understood, however, that any other configurations may also be employed. Each of the one or more optics portions may have any configuration.

In some embodiments, each of the optics portions, e.g., optics portions 1512A-1512D of FIG. 15, comprises a single lens element or a stack of lens elements (or lenslets), although, as stated above. For example, in some embodiments, a single lens element, multiple lens elements and/or compound lenses, with or without one or more filters, prisms and/or masks are employed.

An optical portion can also contain other optical features that are desired for digital camera functionality and/or performance. For example, these features can include electronically tunable filters, polarizers, wavefront coding, spatial filters (masks), and other features not yet anticipated. Some of the features (in addition to the lenses) are electrically operated (such as a tunable filter), or are mechanically movable with MEMs mechanisms.

In some embodiments, one or more photochromic (or photochromatic) materials are employed in one or more of the optical portions. The one or more materials may be incorporated into an optical lens element or as another feature in the optical path, for example, above one or more of the sensor arrays. In some embodiments, photochromatic materials may be incorporated into a cover glass at the camera entrance (common aperture) to all optics (common to all optical channels), or put into the lenses of one or more optical channels, or into one or more of the other optical features included into the optical path of an optics portion over any sensor array.

Figure 17C:
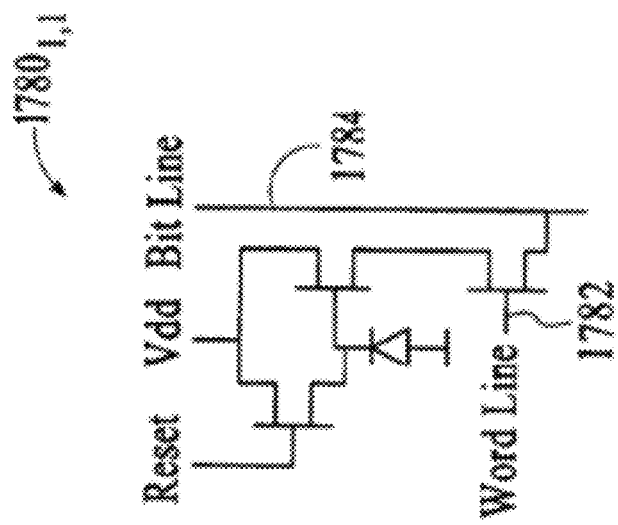
FIGS. 17A-17C are schematic representations of a sensor array, under an embodiment.
Figure 17A:
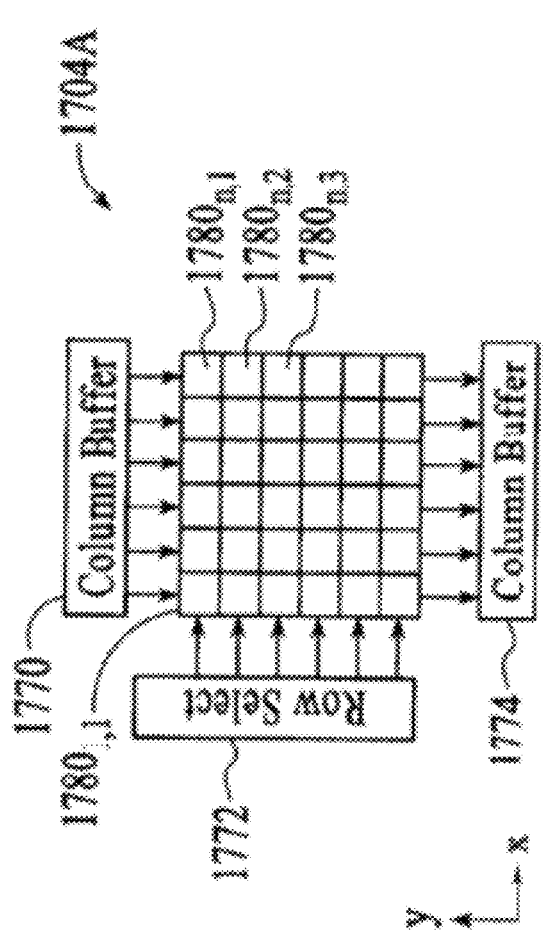
Figure 17B:
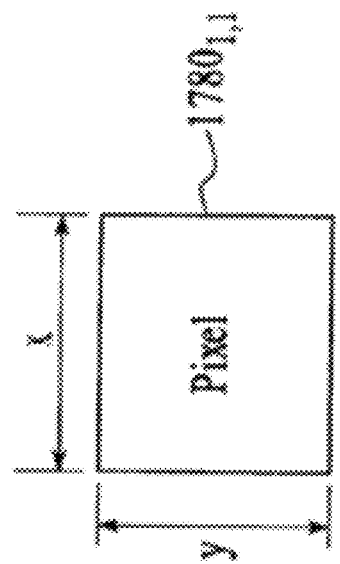

FIGS. 17A-17C are schematic representations of one embodiment of a sensor array 1704. The sensor array is similar to one of the sensor arrays 1504A-1504D of FIG. 15, foe example. As shown in FIG. 17A, the sensor array 1704 is coupled to circuits 1770, 1772, and 1774. The sensor array sensor array 1704 captures light and converts it into one or more signals, such as electrical signals, which are supplied to one or more of the circuits 1770, 1772, and 1774. The sensor array 1704 includes a plurality of sensor elements such as for example, a plurality of identical photo detectors (sometimes referred to as "picture elements" or "pixels"), e.g., pixels $1780_{1,1}$-$1780_{n,m}$. The photo detectors $1780_{1,1}$-$1780_{n,m}$, are arranged in an array, for example a matrix-type array. The number of pixels in the array may be, for example, in a range from hundreds of thousands to millions. The pixels may be arranged for example, in a two-dimensional array configuration, for example, having a plurality of rows and a plurality of columns, e.g., 640 by 480, 1280 by 1024, etc. However, the pixels can be sized and dimensioned as desired, and can be distributed in any desired pattern. Pixels that are distributed without any regular pattern can also used. Referring to FIG. 17B, a pixel, for example pixel $1780_{1,1}$, may be viewed as having x and y dimensions, although the photon capturing portion of a pixel may or may not occupy the entire area of the pixel and may or may not have a regular shape. In some embodiments, the sensor elements are disposed in a plane, referred to herein as a sensor plane. The sensor may have orthogonal sensor reference axes, including for example, an x-axis, a y-axis, and a z-axis, and may be configured so as to have the sensor plane parallel to the x-y plane XY and directed toward the optics portion of the optical channel. Each optical channel has a field of view corresponding to an expanse viewable by the sensor array. Each of the sensor elements may be associated with a respective portion of the field of view.

The sensor array may employ any type of technology, for example, but not limited to MOS pixel technologies (e.g., one or more portions of the sensor are implemented in "Metal Oxide Semiconductor" technology), charge coupled device (CCD) pixel technologies, or combination of both. The sensor array may comprise any suitable material or materials, including, but not limited to, silicon, germanium and/or combinations thereof. The sensor elements or pixels may be formed in any suitable manner.

In operation, the sensor array 1704A, is exposed to light on a sequential line per line basis (similar to a scanner, for example) or globally (similar to conventional film camera exposure, for example). After being exposed to light for certain period of time (exposure time), the pixels $1780_{1,1}$-$1780_{n,m}$, are read out, e.g., on a sequential line per line basis.

In some embodiments, circuitry 1770, also referred to as column logic 1770, is used to read the signals from the pixels $1780_{1,1}$-$1780_{n,m}$. FIG. 17C is a schematic representation of a pixel circuit. The pixels $1780_{1,1}$-$1780_n$, also referred to as sensor elements, may be accessed one row at a time by asserting one of the word lines 1782, which run horizontally through the sensor array 1704A. A single pixel $1780_{1,1}$ is shown. Data is passed into and/or out of the pixel $1780_{1,1}$ via bit lines (such as bit line 1784) which run vertically through the sensor array 1704A.

The pixels are not limited to the configurations shown in FIGS. 17A-17C. As stated above, each of the one or more sensor arrays may have any configuration (e.g., size, shape, pixel design).

The sensor arrays 1502A-1502D of FIG. 15 may or may not be identical to one another. In some embodiments, for example, the sensor arrays are identical to one another. In some other embodiments, one or more of the sensor arrays are different, in one or more respects, from one or more of the other sensor arrays. For example, in some embodiments, one or more of the characteristics (for example, but not limited to, its type of element(s), size (for example, surface area), and/or performance) of one or more of the sensor arrays is tailored to the respective optics portion and/or to help achieve a desired result.

Figure 18:
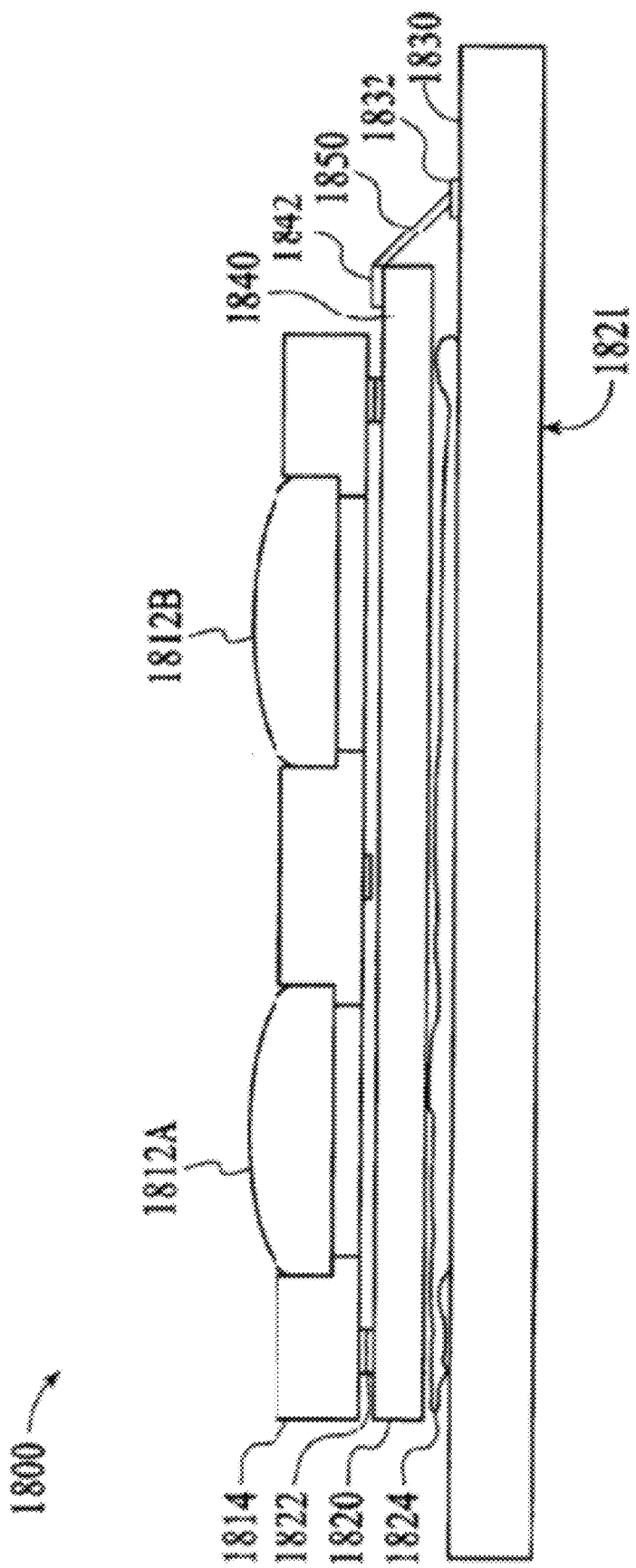
FIG. 18 is a schematic cross-sectional view of a digital camera apparatus, under an embodiment.

FIG. 18 is a schematic cross-sectional view of a digital camera apparatus 1800 including a printed circuit board 1820 of a digital camera on which the digital camera elements are mounted, under an embodiment. In this embodiment, the one or more optics portions, e.g., optics portions 1812A and 1812B are seated in and/or affixed to a support 1814. The support 1814 (for example a frame) is disposed superjacent a first bond layer 1822, which is disposed superjacent an image device 1820, in or on which sensor portions 1812A-1812D (sensor portions 1812C and 1812D are not shown), are disposed and/or integrated. The image device 1820 is disposed superjacent a second bond layer 1824 which is disposed superjacent the printed circuit board 1821.

The printed circuit board 1821 includes a major outer surface 1830 that defines a mounting region on which the image device 1820 is mounted. The major outer surface 1830 may further define and one or more additional mounting regions (not shown) on which one or more additional devices used in the digital camera may be mounted. One or more pads 1832 are provided on the major outer surface 1830 of the printed circuit board to connect to one or more of the devices mounted thereon.

The image device 1820 includes the one or more sensor arrays (not shown), and one or more electrically conductive layers. In some embodiments, the image device 1820 further includes one, some or all portions of a processor for the digital camera apparatus 1800. The image device 1820 further includes a major outer surface 1840 that defines a mounting region on which the support 1814 is mounted.

The one or more electrically conductive layers may be patterned to define one or more pads 1842 and one or more traces (not shown) that connect the one or more pads to one or more of the one or more sensor arrays. The pads 1842 are disposed, for example, in the vicinity of the perimeter of the image device 1820, for example along one, two, three or four sides of the image device 1820. The one or more conductive layers may comprise, for example, copper, copper foil, and/or any other suitably conductive material(s).

A plurality of electrical conductors 1850 may connect one or more of the pads 1842 on the image device 1820 to one or more of the pads 1832 on the circuit board 1821. The conductors 1850 may be used, for example, to connect one or more circuits on the image device 1820 to one or more circuits on the printed circuit board 1821.

The first and second bond layers 1822 and 1824 may comprise any suitable material(s), including but not limited to adhesive, and may comprise any suitable configuration. The first and second bond layers 1822, 1824 may comprise the same material(s) although this is not required. As used herein, a bond layer may be continuous or discontinuous. For example, a conductive layer may be an etched printed circuit layer. Moreover, a bond layer may or may not be planar or even substantially planar. For example, a conformal bond layer on a non-planar surface will be non-planar.

Figure 19:
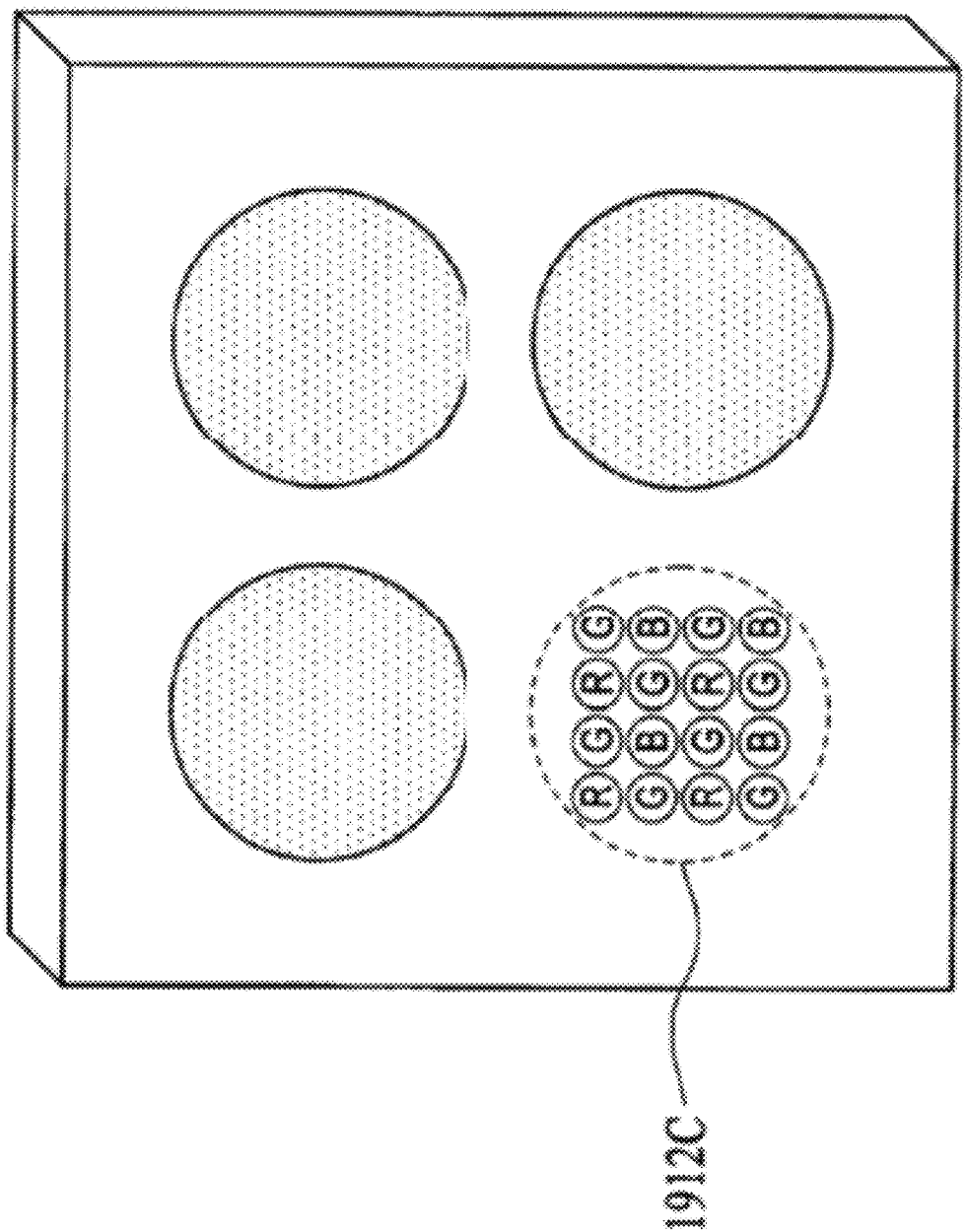
FIG. 19 is a schematic perspective view of a digital camera apparatus having one or more optics portions with the capability to provide color separation, under an embodiment.

FIG. 19 is a schematic perspective view of a digital camera apparatus having one or more optics portions with the capability to provide color separation in accordance with one embodiment of the present invention. In some of such embodiments, one or more of the optics portions, e.g., optics portion 1912C includes an array of color filters, for example, but not limited to a Bayer patter. In some of such embodiments, one or more of the optics portions, e.g., optics portion 1912C has the capability to provide color separation similar to that which is provided by a color filter array.

In some embodiments, the lens and/or filter of the optical channel may transmit both of such colors or bands of colors, and the optical channel may include one or more mechanisms elsewhere in the optical channel to separate the two colors or two bands of colors. For example, a color filter array may be disposed between the lens and the sensor array, and/or the optical channel may employ a sensor capable of separating the colors or bands of colors. In some of the latter embodiments, the sensor array may be provided with pixels that have multiband capability, e.g., two or three colors. For example, each pixel may comprise two or three photodiodes, wherein a first photodiode is adapted to detect a first color or first band of colors, a second photodiode is adapted to detect a second color or band of colors and a third photodiode is adapted to detect a third color or band of colors. One way to accomplish this is to provide the photodiodes with different structures and/or characteristics that make them selective, such that the first photodiode has a higher sensitivity to the first color or first band of colors than to the second color or band of colors, and the second photodiode has a higher sensitivity to the second color or second band of colors than to the first color or first band of colors. Alternatively, the photodiodes are disposed at different depths in the pixel, taking advantage of the different penetration and absorption characteristics of the different colors or bands of colors. For example, blue and blue bands of colors penetrate less (and are thus absorbed at a lesser depth) than green and green bands of colors, which in turn penetrate less (and are thus absorbed at a lesser depth) than red and red bands of colors. In some embodiments, such a sensor array is employed, even though the pixels may see only one particular color or band of colors, for example, to in order to adapt such sensor array to the particular color or band of colors.

Figure 20A:
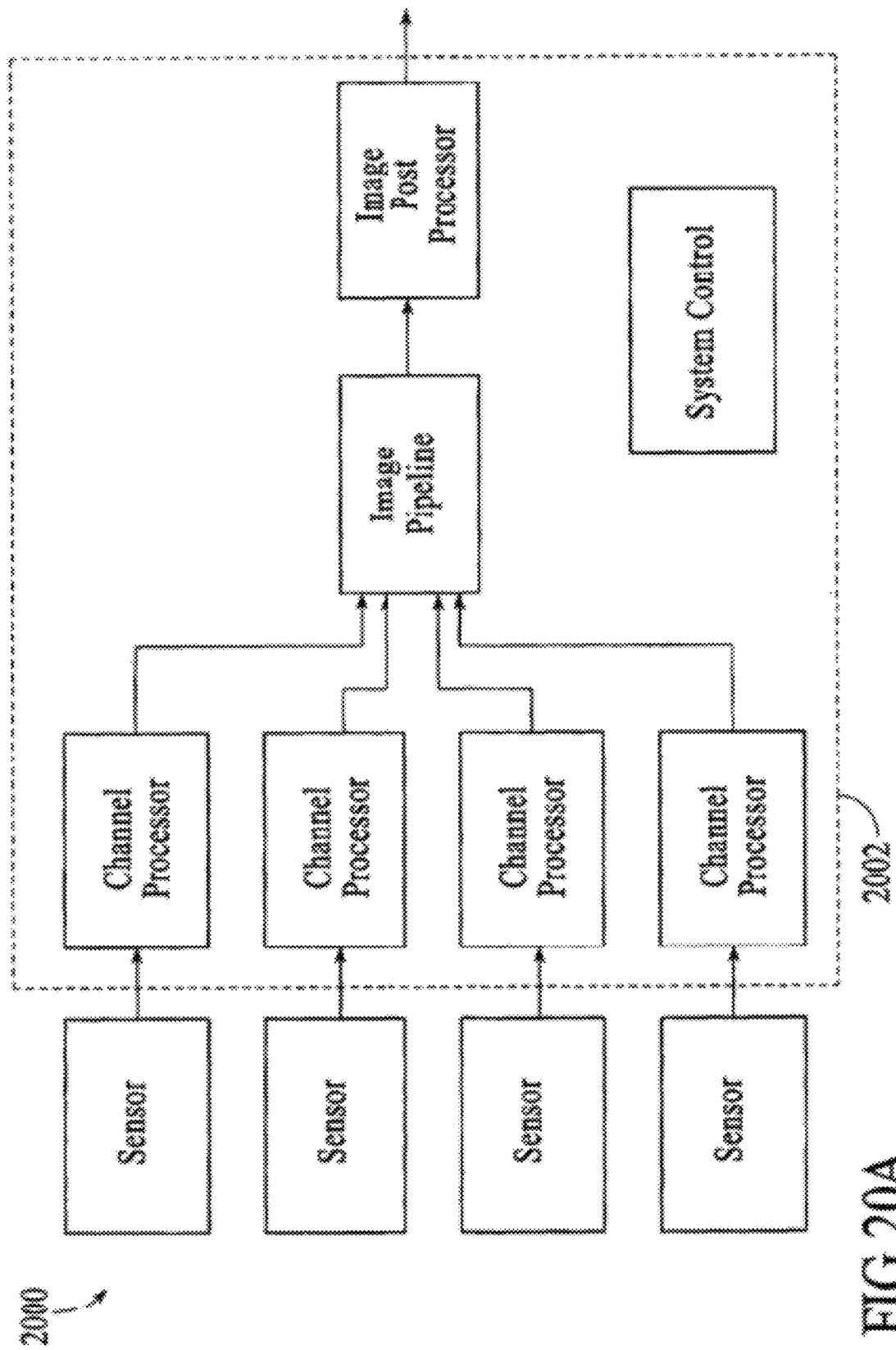
FIG. 20A is a block diagram of a processor of a digital camera subsystem, under an embodiment.

FIG. 20A is a block diagram of a processor 2002 of a digital camera subsystem 2000, under an embodiment. In this embodiment, the processor 2002 includes one or more channel processors, one or more image pipelines, and/or one or more image post processors. Each of the channel processors is coupled to a respective one of the optical channels (not shown) and generates an image based at least in part on the signal(s) received from the respective optical channel. In some embodiments the processor 2002 generates a combined imaged based at least in part on the images from two or more of the optical channels. In some embodiments, one or more of the channel processors are tailored to its respective optical channel, as previously described.

In various embodiments, the gain, noise reduction, dynamic range, linearity and/or any other characteristic of the processor, or combinations of such characteristics, may be adapted to improve and/or optimize the processor to a wavelength or color (or band of wavelengths or colors). Tailoring the channel processing to the respective optical channel makes it possible to generate an image of a quality that is higher than the quality of images resulting from traditional image sensors of like pixel count. In such embodiments, providing each optical channel with a dedicated channel processor helps to reduce or simplify the amount of logic in the channel processors, as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme The images (and/or data which is representative thereof) generated by the channel processors are supplied to the image pipeline, which may combine the images to form a full color or black/white image. The output of the image pipeline is supplied to the post processor, which generates output data in accordance with one or more output formats.

Figure 20B:
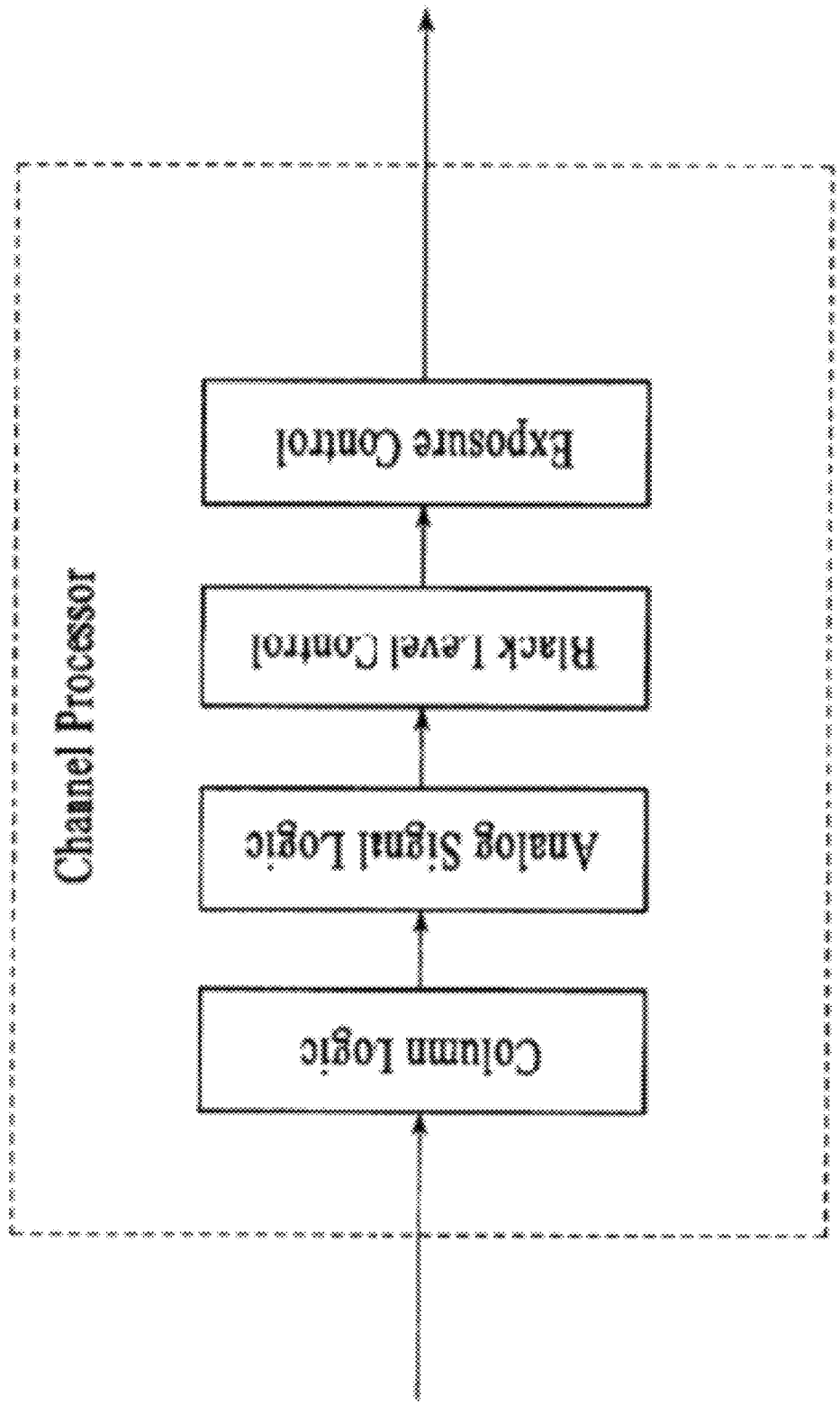
FIG. 20B is a block diagram of a channel processor of a digital camera subsystem, under an embodiment.

FIG. 20B shows one embodiment of a channel processor. In this embodiment, the channel processor includes column logic, analog signal logic, and black level control and exposure control. The column logic is coupled to the sensor and reads the signals from the pixels. Each of the column logic, analog signal logic, black level control and exposure control can be configured for processing as appropriate to the corresponding optical channel configuration (e.g., specific wavelength or color, etc.). For example, the analog signal logic is optimized, if desired, for processing. Therefore, gain, noise, dynamic range and/or linearity, etc., are optimized as appropriate to the corresponding optical channel configuration (e.g., a specific wavelength or color, etc.). As another example, the column logic may employ an integration time or integration times adapted to provide a particular dynamic range as appropriate to the corresponding optical channel.

The output of the analog signal logic is supplied to the black level control, which determines the level of noise within the signal, and filters out some or all of such noise. If the sensor coupled to the channel processor is focused upon a narrower band of visible spectrum than traditional image sensors, the black level control can be more finely tuned to eliminate noise.

The output of the black level control is supplied to the exposure control, which measures the overall volume of light being captured by the array and adjusts the capture time for image quality. Traditional cameras must make this determination on a global basis (for all colors). In the camera of an embodiment, however, the exposure control can be specifically adapted to the wavelength (or band of wavelengths) to which the sensor is configured. Each channel processor is thus able to provide a capture time that is specifically adapted to the sensor and/or specific color (or band of colors) targeted, and which may be different than the capture time provided by another channel processor for another optical channel.

Figure 20C:
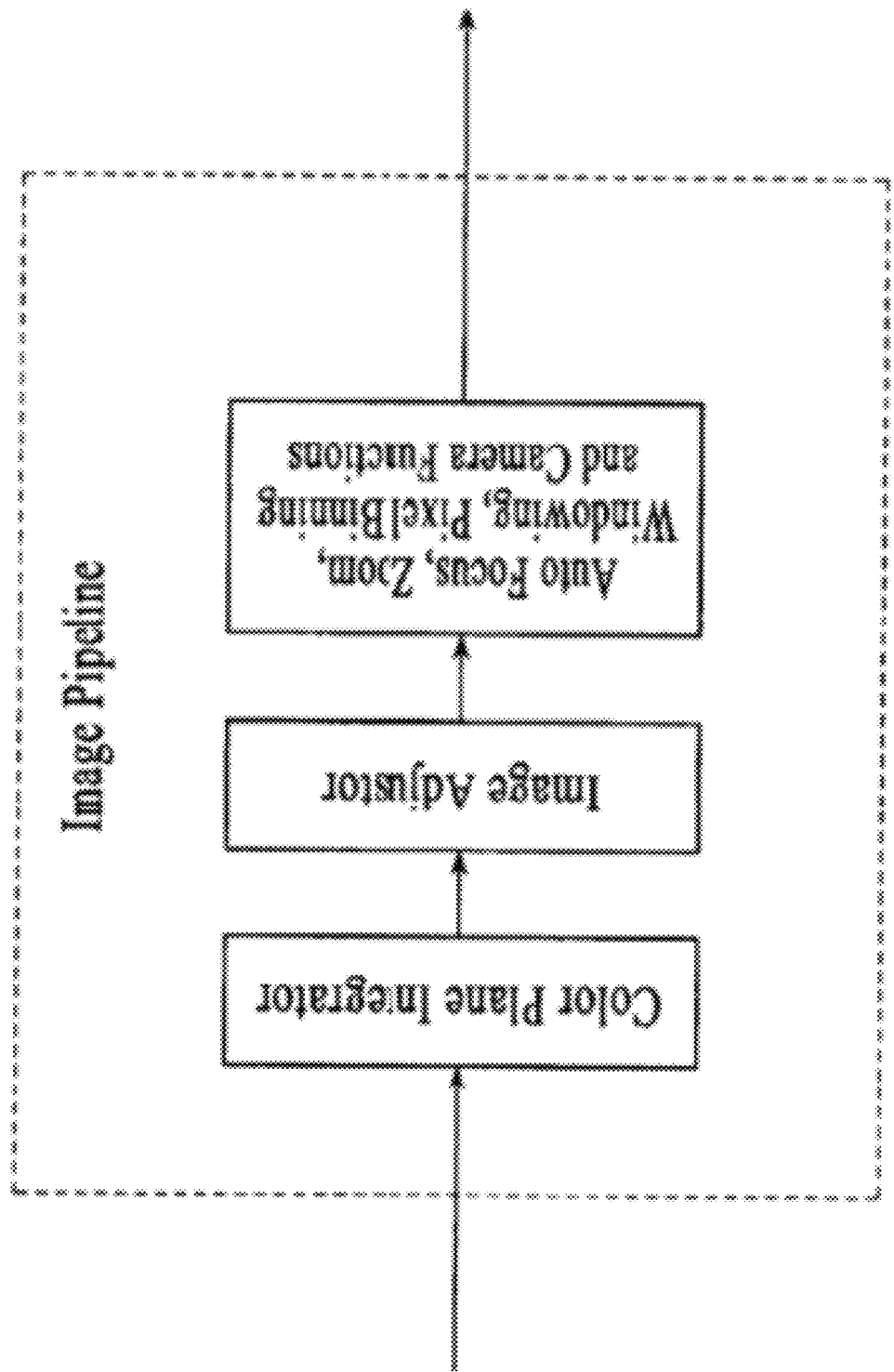
FIG. 20C is a block diagram of an image pipeline of a digital camera subsystem, under an embodiment.

FIG. 20C is a block diagram of the image pipeline, under an embodiment. In this embodiment, the image pipeline includes two portions. The first portion includes a color plane integrator and an image adjustor. The color plane integrator receives an output from each of the channel processors and integrates the multiple color planes into a single color image. The output of the color plane integrator, which is indicative of the single color image, is supplied to the image adjustor, which adjusts the single color image for saturation, sharpness, intensity and hue. The adjustor also adjusts the image to remove artifacts and any undesired effects related to bad pixels in the one or more color channels. The output of the image adjustor is supplied to the second portion of the pipeline, which provides auto focus, zoom, windowing, pixel binning and camera functions.

Figure 20D:
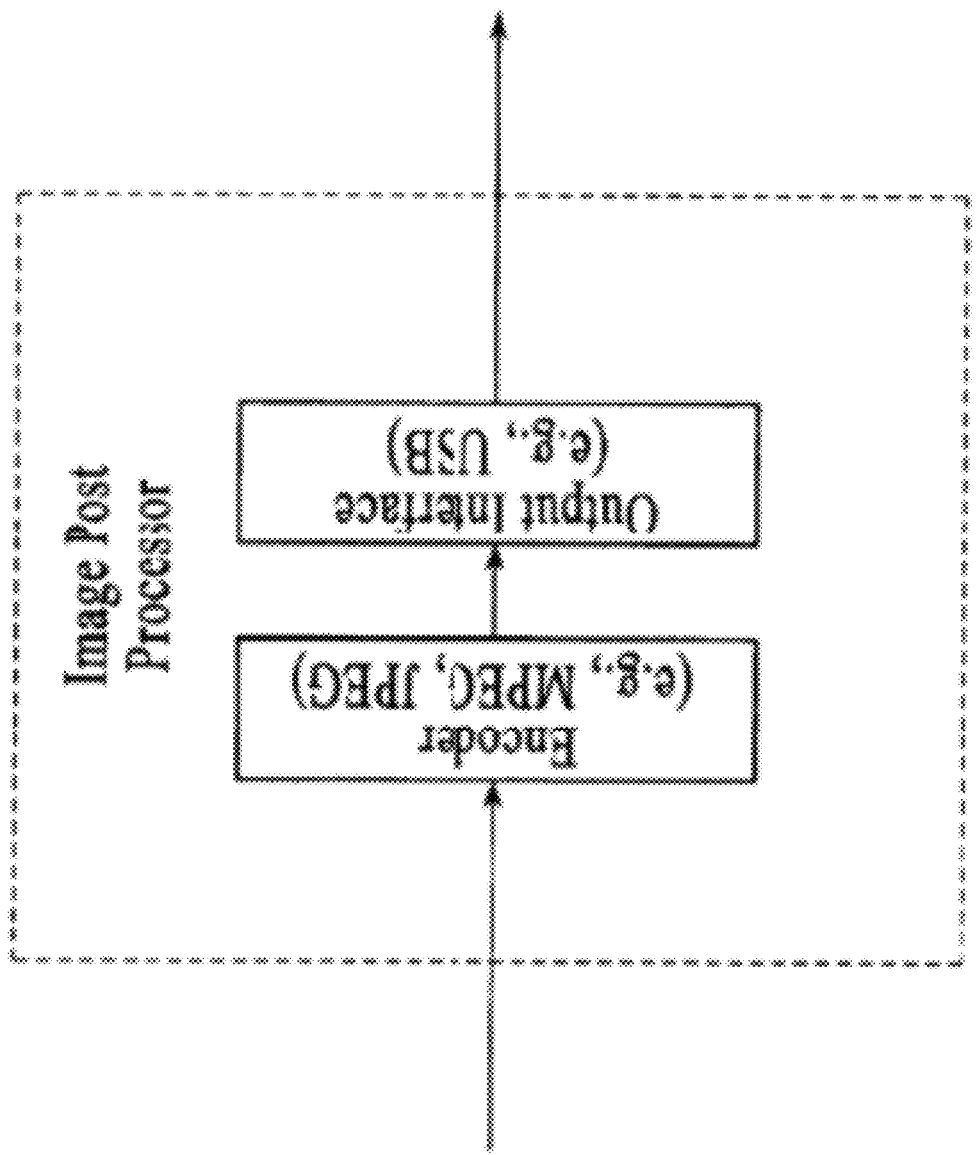
FIG. 20D is a block diagram of an image post processor of a digital camera subsystem, under an embodiment.

FIG. 20D is a block diagram of the image post processor, under an embodiment. In this embodiment, the image post processor includes an encoder and an output interface. The encoder receives the output signal from the image pipeline and provides encoding to supply an output signal in accordance with one or more standard protocols (e.g., MPEG and/or JPEG). The output of the encoder is supplied to the output interface, which provides encoding to supply an output signal in accordance with a standard output interface, e.g., universal serial bus (USB) interface.

Figure 21:
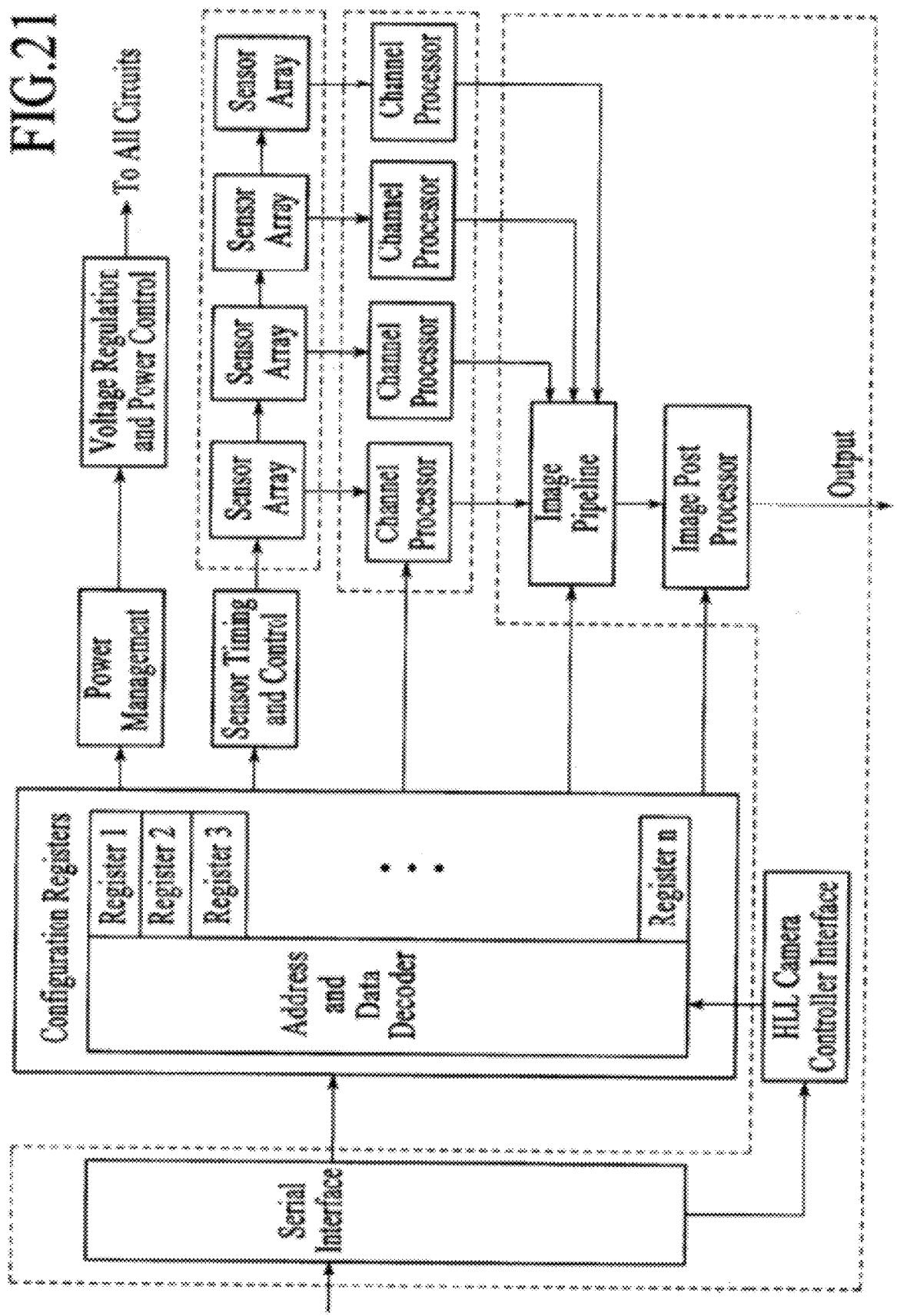
FIG. 21 is a block diagram of digital camera system, including system control components, under an embodiment.

FIG. 21 is a block diagram of digital camera system, including system control components, under an embodiment. The system control portion includes a serial interface, configuration registers, power management, voltage regulation and control, timing and control, a camera control interface and a serial interface, but is not so limited. In some embodiments, the camera interface comprises an interface that processes signals that are in the form of high level language (HLL) instructions. In some embodiments the camera interface comprises an interface that processes control signals that are in the form of low level language (LLL) instructions and/or of any other form now known or later developed. Some embodiments may process both HLL instructions and LLL instructions.

As used herein, the following terms are interpreted as described below, unless the context requires a different interpretation.

"Array" means a group of photodetectors, also know as pixels, which operate in concert to create one image. The array captures photons and converts the data to an electronic signal. The array outputs this raw data to signal processing circuitry that generates the image sensor image output.

"Digital Camera" means a single assembly that receives photons, converts them to electrical signals on a semiconductor device ("image sensor"), and processes those signals into an output that yields a photographic image. The digital camera would included any necessary lenses, image sensor, shutter, flash, signal processing circuitry, memory device, user interface features, power supply and any mechanical structure (e.g. circuit board, housing, etc) to house these components. A digital camera may be a stand-alone product or may be imbedded in other appliances, such as cell phones, computers or the myriad of other imaging platforms now available or to be created in the future, such as those that become feasible as a result of this invention.

"Digital Camera Subsystem" (DCS) means a single assembly that receives photons, converts them to electrical signals on a semiconductor device ("image sensor") and processes those signals into an output that yields a photographic image. The Digital Camera Subsystem includes any necessary lenses, image sensor, signal processing circuitry, shutter, flash and any frame to hold the components as may be required. The power supply, memory devices and any mechanical structure are not necessarily included.

"Electronic media" means that images are captured, processed and stored electronically as opposed to the use of film.

"Frame" or "thin plate" means the component of the DCS that is used to hold the lenses and mount to the image sensor.

"Image sensor" means the semiconductor device that includes the photon detectors ("pixels"), processing circuitry and output channels. The inputs are the photons and the output is the image data.

"Lens" means a single lens or series of stacked lenses (a column one above the other) that shape light rays above an individual array. When multiple stacks of lenses are employed over different arrays, they are called "lenses."

"Package" means a case or frame that an image sensor (or any semiconductor chip) is mounted in or on, which protects the imager and provides a hermetic seal.

"Packageless" refers to those semiconductor chips that can be mounted directly to a circuit board without need of a package.

The terms "Photo-detector" and "pixels" mean an electronic device that senses and captures photons and converts them to electronic signals. These extremely small devices are used in large quantities (hundreds of thousands to millions) in a matrix to capture an image.

"Semiconductor Chip" means a discrete electronic device fabricated on a silicon or similar substrate, which is commonly used in virtually all electronic equipment.

"Signal Processing Circuitry" means the hardware and software within the image sensor that translates the photon input information into electronic signals and ultimately into an image output signal.

Aspects of the digital camera systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the digital camera systems and methods include: microcontrollers with memory (such as electronically erasable programmable read only memory (EEPROM)), embedded microprocessors, firmware, software, etc. Furthermore, aspects of the digital camera systems and methods may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that components of the various systems and methods disclosed herein may be described using computer aided design tools and expressed (or represented), as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media).

Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described systems and methods may be processed by a processing entity (e.g., one or more processors) within the computer system in conjunction with execution of one or more other computer programs.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the digital camera systems and methods is not intended to be exhaustive or to limit the digital camera systems and methods to the precise form disclosed. While specific embodiments of, and examples for, the digital camera systems and methods are described herein for illustrative purposes, various equivalent modifications are possible within the scope of the digital camera systems and methods, as those skilled in the relevant art will recognize. The teachings of the digital camera systems and methods provided herein can be applied to other processing systems and methods, not only for the systems and methods described above.

The elements and acts of the various embodiments described above can be combined to provide further embodiments. These and other changes can be made to the digital camera systems and methods in light of the above detailed description.

In general, in the following claims, the terms used should not be construed to limit the digital camera systems and methods to the specific embodiments disclosed in the specification and the claims, but should be construed to include all systems that operate under the claims. Accordingly, the digital camera systems and methods are not limited by the disclosure, but instead the scope of the digital camera systems and methods is to be determined entirely by the claims.

While certain aspects of the digital camera systems and methods are presented below in certain claim forms, the inventors contemplate the various aspects of the digital camera systems and methods in any number of claim forms. Accordingly, the inventors reserve the right to add additional claims after filing the application to pursue such additional claim forms for other aspects of the digital camera systems and methods.

What is claimed is:

1. A digital camera comprising:
a plurality of sensors, wherein each sensor of the plurality of sensors comprises an array of photo-detectors;
a plurality of optics components, wherein each optics component of the plurality of optics components is configured to pass light to a sensor of the plurality of sensors, wherein each optics component and an associated sensor form one of a plurality of channels; and
a processing component coupled to the plurality of channels and configured to separately control an integration time of each sensor during a frame, wherein the processing component is configured to combine data from the plurality of sensors received during the frame to provide an image.

2. The digital camera of claim 1, wherein each sensor is configured to image the same field of view.

3. The digital camera of claim 1, wherein the integration time of at least one sensor is relatively shorter than the integration time of at least one other sensor.

4. The digital camera of claim 1, further comprising an interface operatively coupled to the processing component, wherein the interface is configured to receive the integration time of each sensor as an input to the digital camera.

5. The digital camera of claim 1, further comprising an interface operatively coupled to the processing component, wherein the interface is configured to receive an indication of an amount of incident light as an input.

6. The digital camera of claim 1, wherein the processing component is configured to control the integration time of each sensor in response to an input by an operator.

7. The digital camera of claim 1, wherein the integration times of the plurality of sensors are controlled based on an incident light level.

8. The digital camera of claim 1, wherein the image corresponds to a first frame, and wherein the processing component is further configured to determine one or more integration times for a second frame based at least in part on the image.

9. A digital camera comprising:
a plurality of channels, wherein each channel of the plurality of channels includes an optics component and a sensor comprising an array of photo-detectors; and
a processing component coupled to the plurality of channels, wherein the processing component is configured to separately control an integration time of each channel of the plurality of channels during a frame, wherein the processing component is configured to combine data from the plurality of channels received during the frame to provide an image.

10. The digital camera of claim 9, wherein each sensor is configured to image the same field of view.

11. The digital camera of claim 9, wherein the integration time of at least one channel is relatively shorter than the integration time of at least one other channel.

12. The digital camera of claim 9, wherein the processing component is configured to use the image to determine the integration time for each channel for use during a subsequent frame.

13. The digital camera of claim 9, wherein the processing component is configured to automatically control the integration time of each sensor.

14. The digital camera of claim 9, wherein the integration time is used to control an amount of electrical charge placed on one or more storage devices associated with a sensor.

15. A method comprising:
controlling each sensor of a plurality of sensors of a digital camera based at least in part on an integration time corresponding to the sensor;
capturing data with each of the plurality of sensors, wherein the data captured by each sensor is based at least in part on the integration time of the sensor; and
generating an image by combining the data captured by each of the plurality of sensors.

16. The method of claim 15, wherein a first integration time of a first sensor is less than a second integration time of a second sensor.

17. The method of claim 15, further comprising determining a subsequent integration time for each of the plurality of sensors based at least in part on the image.

18. The method of claim 15, further comprising analyzing a previous image generated by the digital camera.

19. The method of claim 15, further comprising separately controlling a parameter of an optics component associated with each channel of a plurality of channels.

20. The method of claim 15, wherein controlling each sensor comprises providing an electrical charge to each sensor for a period of time, wherein the period of time comprises an integration time corresponding to the sensor.

* * * * *

UNITED STATES PATENT AND TRADEMARK OFFICE
CERTIFICATE OF CORRECTION

PATENT NO. : 8,334,494 B2
APPLICATION NO. : 13/465229
DATED : December 18, 2012
INVENTOR(S) : Olsen et al.

It is certified that error appears in the above-identified patent and that said Letters Patent is hereby corrected as shown below:

On Title Page 2, in Item (56), under "OTHER PUBLICATIONS", in Column 2, Line 27, delete "Donding" and insert -- Bonding --, therefor.

On Title Page 2, in Item (56), under "OTHER PUBLICATIONS", in Column 2, Line 30, delete "(TOMBO0 with color filters," SPEI" and insert -- (TOMBO) with color filters," SPIE --, therefor.

In the Specification

In Column 2, Line 40, delete "INCORPORATION BY REFERENCE" and insert -- BRIEF DESCRIPTION OF DRAWINGS --, therefor.

In Column 11, Line 21, delete "300 integration time controller" and insert -- integration time controller 300 --, therefor.

In Column 16, Line 43, delete "digital) e.g.," and insert -- digital (e.g., --, therefor.

In Column 18, Line 62, delete "foe" and insert -- for --, therefor.

In Column 18, Lines 64-65, delete "sensor array sensor array" and insert -- sensor array --, therefor.

In Column 19, Line 46, delete "$1780_{1,1}$-$1780_n$," and insert -- $1780_{1,1}$-$1780_{n,m}$, --, therefor.

In Column 20, Line 2, delete "board 1820" and insert -- board 1821 --, therefor.

In Column 21, Line 59, delete "extreme" and insert -- extreme. --, therefor.

In Column 23, Line 9, delete "know" and insert -- known --, therefor.

Signed and Sealed this
Eighth Day of October, 2013

Teresa Stanek Rea
*Deputy Director of the United States Patent and Trademark Office*